(12) United States Patent
Potyrailo et al.

(10) Patent No.: US 9,389,260 B2
(45) Date of Patent: Jul. 12, 2016

(54) SYSTEMS AND METHODS FOR MONITORING SENSORS

(71) Applicant: General Electric Company, Schenectady, NY (US)

(72) Inventors: Radislav Alexandrovich Potyrailo, Niskayuna, NY (US); Jeffrey Michael Ashe, Gloversville, NY (US); Sm Shajed Hasan, Niskayuna, NY (US); Naresh Kesavan Rao, Clifton Park, NY (US); Krishnakumar Sundaresan, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 31 days.

(21) Appl. No.: 13/630,939

(22) Filed: Sep. 28, 2012

(65) Prior Publication Data

US 2014/0095102 A1 Apr. 3, 2014

(51) Int. Cl.
| G06F 15/00 | (2006.01) |
| G01R 27/02 | (2006.01) |
| G01R 27/28 | (2006.01) |
| G01R 31/28 | (2006.01) |

(52) U.S. Cl.
CPC ............ *G01R 27/28* (2013.01); *G01R 31/2824* (2013.01)

(58) Field of Classification Search
CPC .............................. G01R 27/28; G01R 31/2824
USPC ............ 340/10.1, 691.1, 572.1, 10.41, 10.51, 340/572.8; 324/655; 700/109; 327/155–159; 341/155
See application file for complete search history.

(56) References Cited

U.S. PATENT DOCUMENTS

| 7,808,235 | B2* | 10/2010 | Rollins et al. ............. 324/207.26 |
| 7,948,385 | B2 | 5/2011 | Potyrailo et al. |
| 8,111,143 | B2 | 2/2012 | Tong et al. |
| 8,159,347 | B2 | 4/2012 | Potyrailo et al. |
| 2002/0089356 | A1* | 7/2002 | Perrott et al. .................. 327/105 |
| 2003/0179024 | A1* | 9/2003 | Montagnana .................. 327/156 |
| 2005/0058460 | A1* | 3/2005 | Wang ............................. 398/195 |
| 2005/0093760 | A1* | 5/2005 | Rochelle et al. .............. 343/867 |
| 2006/0238349 | A1* | 10/2006 | Hu ......................... H01Q 23/00 340/572.7 |
| 2007/0064839 | A1* | 3/2007 | Luu ....................... H04L 1/0045 375/340 |

(Continued)

FOREIGN PATENT DOCUMENTS

WO 2012002882 A1 1/2012

OTHER PUBLICATIONS

Suresh et al., Piezoelectric based resonant mass sensor using phase measurement, 2010, Elsevier, pp. 320-325.*

*Primary Examiner* — Janet Suglo
*Assistant Examiner* — Lisa Peters
(74) *Attorney, Agent, or Firm* — Seema S. Katragadda

(57) ABSTRACT

An impedance analyzer is provided. The analyzer includes a signal excitation generator comprising a digital to analog converter, where a transfer function of the digital to analog converter from digital to analog is programmable. The impedance analyzer further includes a receiver comprising a low noise amplifier (LNA) and an analog to digital converter (ADC), where the LNA is a current to voltage converter; where the programmable digital to analog transfer function is implemented by a direct digital synthesizer (DDS) and a voltage mode digital to analog converter, or a digital phase locked loop (PLL), or both. Further, a multivariable sensor node having an impedance analyzer is provided. Furthermore, a multivariable sensor network having a plurality of multivariable sensor nodes is provided.

9 Claims, 13 Drawing Sheets

(56) References Cited

U.S. PATENT DOCUMENTS

| | | |
|---|---|---|
| 2007/0090927 A1 | 4/2007 | Potyrailo et al. |
| 2009/0140728 A1* | 6/2009 | Rollins et al. ............ 324/207.16 |
| 2009/0204250 A1 | 8/2009 | Potyrailo et al. |
| 2009/0278685 A1 | 11/2009 | Potyrailo et al. |
| 2010/0042338 A1* | 2/2010 | Giurgiutiu et al. .............. 702/39 |
| 2010/0231407 A1 | 9/2010 | Carr |
| 2010/0250170 A1* | 9/2010 | Kalinin et al. .................. 702/77 |
| 2011/0101996 A1* | 5/2011 | Potyrailo ...................... 324/655 |
| 2012/0001730 A1* | 1/2012 | Potyrailo et al. ............. 340/10.1 |

\* cited by examiner

SYSTEMS AND METHODS FOR MONITORING SENSORS

BACKGROUND

The invention relates generally to sensors, and more particularly to systems and methods for monitoring sensors.

Resonant sensors, such as passive radio frequency identification (RFID) sensors, inductor-capacitor-resistor (LCR) sensors, thickness shear mode (TSM) resonator sensors, acoustic wave (AW) sensors, surface acoustic wave (SAW) sensors, tuning fork sensors, split ring resonator (SRR) sensors, are used to provide information about physical, chemical, and biological constituents in a sample.

Portable systems including resonant sensors and corresponding impedance readers are desirable for field measurements. However, maintaining the same quality of data-acquisition as compared to the expensive desktop laboratory systems remains a challenge. Also, high amount of power consumption of the portable devices render them unsuitable for long term use.

Therefore, it is desirable to provide methods and systems for monitoring of resonance properties of sensors using portable and low-power consumption devices.

BRIEF DESCRIPTION

In one embodiment, an impedance analyzer includes a signal excitation generator comprising a digital to analog converter, where a transfer function of the digital to analog converter from digital to analog is programmable. The impedance analyzer further includes a receiver comprising a low noise amplifier (LNA) and an analog to digital converter (ADC), where the LNA is a current to voltage converter; where the programmable digital to analog transfer function is implemented by a direct digital synthesizer (DDS) and a voltage mode digital to analog converter, or a digital phase locked loop (PLL), or both.

In another embodiment, a multivariable sensor node includes a resonant sensor; an impedance analyzer configured to monitor a plurality of responses from the resonant sensor; a data transmitter configured to transmit sensor data; and an on-board electrical energy source configured to power the impedance analyzer and the data transmitter.

In yet another embodiment, a multivariable sensor node includes a resonant sensor; an impedance analyzer, where the impedance analyzer is configured to monitor a resonance property of the resonant sensor. The impedance analyzer includes a voltage excitation generator comprising a direct digital synthesizer (DDS), or a digital phase locked loop, or both, and a voltage-mode digital to analog converter (DAC). Further, the sensor node includes a receiver comprising current-to-voltage converter (CVC) trans-impedance amplifier and analog to digital converter (ADC).

In another embodiment, a multivariable sensor node includes a sensor; an impedance analyzer, where the impedance analyzer is configured to monitor a property of the sensor. The impedance analyzer includes a voltage excitation generator comprising a direct digital synthesizer (DDS), or a digital phase locked loop, or both, and a voltage-mode digital to analog converter (DAC). Further, the sensor node includes a receiver comprising current-to-voltage converter (CVC) trans-impedance amplifier and analog to digital converter (ADC).

In another embodiment, a multivariable sensor node includes a sensor, an impedance analyzer, wherein the impedance analyzer is configured to monitor a frequency response of the sensor. The impedance analyzer includes a voltage excitation generator containing a direct digital synthesizer (DDS) and a voltage-mode digital to analog converter (DAC). Further, the sensor node includes a receiver comprising current-to-voltage converter (CVC) trans-impedance amplifier and analog to digital converter (ADC).

In yet another embodiment, a multivariable sensor network includes a plurality of individual multivariable sensor nodes, a data processing module, and a data communication module.

DRAWINGS

These and other features, aspects, and advantages of the invention will become better understood when the following detailed description is read with reference to the accompanying drawings in which like characters represent like parts throughout the drawings, wherein.

DETAILED DESCRIPTION

Figure 1:
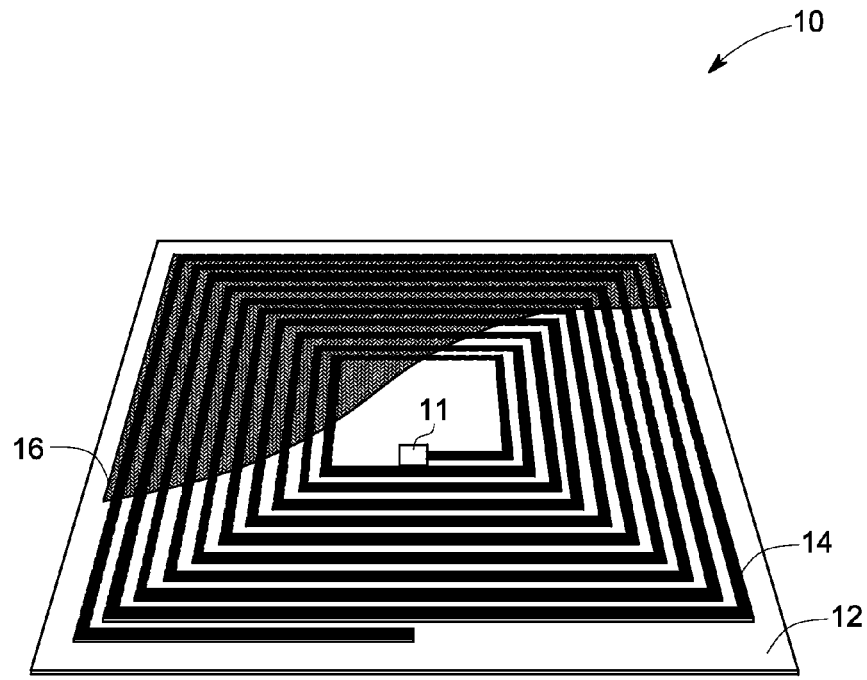
FIG. 1 is a schematic representation of a multivariate resonant sensor, in accordance with embodiments of the present technique.

Embodiments relate to sensors and impedance analyzers used to monitor the sensors. The sensors may be resonant or non-resonant sensors. In certain embodiments, the sensors may be a part of a sensor network. In some embodiments, a resonant sensor may be integrated with the impedance analyzer to form a resonance impedance reader module. The sensor network may be a wired or wireless network. Advantageously, the resonance impedance reader module comprising the resonant sensor and the impedance analyzer may be a single-chip structure. In one embodiment, the resonant sensor may be integrated with the impedance analyzer to form a multivariable sensor node for the sensor network.

In certain embodiments, a sensor may include a multivariable sensor. In some embodiments, the multivariable sensor may include a sensor that is configured to provide more than one independent responses when measurements of a sensor impedance are performed over a measured spectral frequency range of the sensor. The sensor may be resonant and non-resonant over the measured spectral frequency range of the sensor. In certain embodiments, the sensor may include a device with at least one electrode to probe the electric, dielectric, and magnetic properties of the environment in proximity or in contact with the sensor.

In certain embodiments, the impedance analyzer may include a signal excitation generator, and a receiver. The excitation generator may include a digital to analog converter, wherein a transfer function of the digital to analog converter from digital to analog is programmable. The receiver may include a low noise amplifier (LNA) and an analog to digital converter (ADC), wherein the LNA is a current to voltage converter. In certain embodiments, the programmable digital to analog transfer function is implemented by a direct digital synthesizer (DDS) and a voltage mode digital to analog converter, or a digital phase locked loop (PLL), or both.

In certain embodiments, the impedance analyzer may be configured to measure real and imaginary parts of the impedance spectrum of a resonant sensor. The impedance analyzer may also measure the real and imaginary parts of the impedance spectrum of the fluid. Besides measurements of the complex impedance spectra parameters, the impedance analyzer may measure other spectral parameters, related to the complex impedance spectra. Non-limiting examples of the spectral parameters include S-parameters (scattering parameters) and Y-parameters (admittance parameters). In some embodiments, the impedance analyzer may be configured to monitor a sensor in real-time. Further, the impedance analyzer may be configured to monitor in an intermittent or continuous fashion. In certain embodiments, the impedance analyzer may be a portable device. The small size of the impedance analyzer makes it convenient to integrate the resonant sensor with the impedance analyzer in a single chip configuration. In one embodiment, the single chip configuration may be configured to act as a multivariable sensor node in a sensor network. Advantageously, the small size of the impedance analyzer may be accompanied with lower power requirements for the multivariable sensor node. In one embodiment, a size of the single chip sensor node may be in a range from about 5 mm×5 mm×1 mm to about 10 mm×10 mm×2 mm, to about 15 mm×15 mm×4 mm.

In certain embodiments, the impedance analyzer includes a current to voltage converter (CVC) trans-impedance amplifier integrated with the ADC. In one embodiment, the integration of the trans-impedance amplifier with the ADC may facilitate reduction of a footprint of the impedance analyzer. Alternatively, or in addition, the integration may facilitate reduced power consumption of the impedance analyzer and the physical coupling of the trans-impedance amplifier and the ADC improves noise performance by eliminating resistive and parasitic losses. In one embodiment, a design of the ADC may be configured to reduce the number of bits in the ADC to reduce the total power consumption of the impedance analyzer. In one embodiment, the analog to digital conversion in the impedance analyzer may comprise low-power successive approximation register (SAR) analog to digital converter. In one embodiment, the network analyzer may include a mixer configured to down convert a radio frequency signal to a baseband signal.

In one embodiment, the impedance analyzer may comprise Fast Fourier Transform (FFT) architecture to directly down-convert a sensor signal from the resonant sensor. In one example, the FFT architecture may comprise a single signal channel. In one example, the FFT architecture may be formed by removing a heterodyne mixer and one or more intermediate frequency (IF) stages. Advantageously, the FFT architecture enables replacing the analog hardware with lower power digital computation, obtaining information representative of amplitude and phase from a single analog channel, at least partially suppressing out-of-band noise, and digitally tuning the down-conversion of the signals.

In one embodiment, the impedance analyzer may comprise filters to reduce the level of undesirable signals and noise sources. Non-limiting examples of such filters may include a low pass filter, a bandpass filter, or combinations thereof. In one example, the low pass filter may be used to at least partially filter out higher frequency signals from being aliased in the analog-digital converter sampling. In another example, the bandpass filter may be used to at least partially reduce undesirable lower frequency signals from consuming the dynamic range when sampled by the analog to digital converter. These undesirable lower frequency signals may be one or more of a thermal noise from random sources, an interference noise from interfering devices, a spurious noise from the impedance analyzer, or the like.

In some embodiments, the impedance analyzer may be configured to monitor a plurality of responses from a resonant sensor. The impedance analyzer may be in operative association with the resonant sensor through a reader antenna. In one embodiment, the impedance analyzer may be configured to monitor a resonance property of the resonant sensor. The data from the resonant sensor may be transmitted within a wired or a wireless sensor network. In one embodiment, a multivariable sensor node may be a part of a wireless sensor network. In another embodiment, the multivariable sensor node may be a part of a wired sensor network.

In certain embodiments, a multivariable sensor node may comprise a resonant sensor, an impedance analyzer, a data transmitter to transmit sensor data; and an on-board electrical energy source to power the impedance analyzer and the data transmitter. In one embodiment, the resonant sensor and the impedance analyzer may form an integrated structure in the multivariable sensor node. In one example, the resonant sensor and the impedance analyzer comprise a single-chip arrangement in the multivariable sensor node.

In one embodiment, a master clock speed for the DDS, DAC and ADC may be adaptively adjusted based upon an excitation frequency. The excitation frequency in turn may be based on frequencies for which the resonant sensor is responsive to certain analytes. In one embodiment, a speed of the master clock may be increased to that of the DDS and DAC to generate a higher frequency excitation. Increasing the speed of the DDS and DAC may require an equivalent increase in the clock speed of the analog to digital converter. Conversely, to generate a lower frequency excitation, the master clock speed is decreased to the DDS and DAC. Decreasing the speed of the DDS and DAC may require an equivalent decrease in the clock speed of the analog to digital converter. Advantageously, in some embodiments, adaptively adjusting the speed of the master clock enables the user to use the same digital processing of the DDS and ADC signals regardless of excitation frequency. Further, adaptively adjusting the speed of the master clock enables lower power consumption at lower frequencies, e.g., by running the master clock at lower speeds.

In certain embodiments, the impedance analyzer may be a response analyzer that is configured to any frequency. Further, the impedance analyzer may measure the frequency response of the sensor. In some embodiments, the impedance analyzer may use a reflection coefficient method to measure the impedance of a device, such as a sensor. The impedance analyzer may measure two-terminal devices, such as but not limited to, resonators, capacitors, inductors, memristors, diodes, and combinations thereof. In one embodiment, the impedance analyzer may be configured to provide the required measured frequency spectral response of the sensor.

In certain embodiments, a multivariable sensor node may be a sensor that is a standalone multivariable sensor node and is a part of a wired or wireless sensor network. Individual sensors may be arranged into a sensor network where sensors communicate with each other and with a central station. In particular, individual sensors may be arranged into a sensor network. In a wireless sensor network, individual sensors are typically arranged into wireless sensor nodes (also known as motes) with the key hardware (long-lifetime battery or energy harvesting source, simple signal conditioning components, low-power processor) and software (small needed memory, computational capacity, high modularity, inter-operability) requirements for individual nodes. In certain embodiments, the arrangement of individual multivariable sensor nodes into a distributed network may be used for physical and gas sensing applications. In some of these embodiments, it may be desirable to provide required power to the individual multivariable sensor nodes. Further, it may be desirable to manage massive heterogeneous data from the sensor network.

In certain embodiments, the multivariable sensor node may comprise a processing and communication module (PCM). In some embodiments, the PCM may include a digital signal processing portion which may implement the low-power FFT operations, multivariate parameter estimation, or both. In one embodiment, the PCM may include a communication portion which formats and transmits the data by wireless or wired means.

In some embodiments, the multivariable sensor node may comprise a power supply. The power supply may be coupled to the multivariable sensor node using a wired or wireless connection. In some of these embodiments, the multivariable sensor node may be operable using a power supply that is hard wired to a remote electrical power source, such as an electric grid. In other embodiments, the multivariable sensor node may be operable using a power supply that is wirelessly coupled to a remote electrical power source. In one embodiment, the multivariable sensor node may be operatively coupled to a battery, a supercapacitor, an energy harvesting device, or combinations thereof. In one embodiment, the multivariable sensor node may be coupled to a finite electrical power source, which is self-contained (i.e., internal) within the multivariable sensor node, such as a relatively small portable battery consisting of one or more disposable dry cells or rechargeable cells. Alternatively, the multivariable sensor node may be coupled to a finite electrical power harvesting source, such as a supercapacitor, or other.

In certain embodiments, the resonant sensors may be used to measure a variety of physical, chemical and/or biological parameters. The sensors may be wireless resonant sensors or wired resonant sensors. In some embodiments, the resonant sensor may comprise a resonant transducer structure, such as but not limited to, an inductor-capacitor-resistor (LCR) sensor, a thickness shear mode (TSM) resonator sensor, an acoustic wave (AW) sensor, a surface acoustic wave (SAW) sensor, a tuning fork sensor, a split ring resonator (SRR) sensor, a dual split ring resonator (DSRR) sensor, or combinations thereof.

In one example, the resonant sensor may be a RFID sensor. The RFID sensor may comprise a memory chip. The memory chip may be used to store and retrieve data when required. The data may include a digital ID of the RFID sensor, or any other information of the RFID sensor. The memory chip may be a read-write chip, such as an integrated circuit (IC) chip. Alternatively, the memory chip may be a read-only chip, such as an acoustic wave device chip. The memory chip may be an analog input for a separate sensor.

As used herein the term "RFID tag" refers to a data storage and reporting technology that uses electronic tags for storing data and which contains at least two components where the first component is an integrated circuit (memory chip) for storing and processing information, and modulating and demodulating a radio frequency signal. This memory chip can also be used for other specialized functions, for example it can contain a capacitor. In one embodiment, the memory chip may also contain an input for an analog signal. The second component is an antenna for receiving and transmitting the radio frequency signal. In certain embodiments, a RFID tag with a sensing function is a RFID sensor.

In certain embodiments, a RFID sensor may comprise a RFID tag with an added sensing function as, for example, when an antenna of the RFID tag also performs sensing functions by changing its complex impedance parameters as a function of environmental changes. The determinations of environmental changes with such RFID sensors are performed by analysis of complex impedance. In one embodiment, a RFID tag may be converted into a RFID sensor by coupling a complementary sensor across antenna and or/memory chip of the RFID tag. By coupling the complementary sensor, electrical response of the attached sensor may be translated into corresponding change in one or more of a complex impedance response, a resonance peak position, a peak width, a peak height and peak symmetry of the complex impedance response of the sensor antenna, magnitude of the real part of the complex impedance, resonant frequency of the imaginary part of the complex impedance, anti-resonant frequency of the imaginary part of the complex impedance, zero-reactance frequency, phase angle, and magnitude of impedance.

In certain embodiments, the RFID sensors may be used to measure a variety of physical, chemical and biological parameters. The methods and systems for integrated interrogation may be used to collect both digital and analog signals from the RFID sensor to obtain digital or analog data (e.g. tag ID, end-user stored information, sensing information, any other digital information available from the tag) corresponding to the RFID tag, and analog data (e.g., sensing measurements, reflected power measurements) corresponding to the RFID sensors. In one embodiment, the RFID tag of the RFID sensor may be a passive tag. A passive RFID tag does not need a battery for its function and comprises a memory chip that is connected to the sensor antenna.

In certain embodiments, instead of measuring the bulk impedance response of a material, the systems may be configured to measure material changes in the resonant sensor upon exposure to relatively small concentrations of an analyte. The material having the analyte may be disposed between the electrodes that constitute a resonant circuit in the resonant sensors. Thus, dielectric, dimensional, charge transfer, and other changes of materials properties may be detected by the changes in the resonant properties of the circuit. Advantageously, the changes in the resonant circuits may be detected with much higher sensitivity compared to non-resonant transducer.

In some embodiments, the sensor impedance spectra may be processed to extract several "spectral parameters". The spectral parameters are $F_p$, $Z_p$, $F_1$, or $F_2$ and others. The sensor impedance spectrum may be transmitted to the central computing center for processing. In one example, the central computing center may analyze at least a portion of the impedance spectrum or spectral features using steady state or dynamic responses from the impedance reader. The steady state sensor response is a response from the sensor over a determined period of time, where the response does not appreciably change over the measurement time. Thus, measurements of steady state sensor response over time produce similar values. The dynamic sensor response is a response from the sensor upon a sudden change in the measured environmental parameter (temperature, pressure, chemical concentration, biological concentration, etc.) Thus, the sensor response does significantly change over the measurement time. Thus, measurements of dynamic sensor response over time produce dynamic signature of response. Non-limiting examples of the dynamic signature of the response include average response slope, average response magnitude, largest positive slope of signal response, largest negative slope of signal response, average change in signal response, maximum positive change in signal response, and maximum negative change in signal response.

In certain embodiments, two different approaches may be used for sensing. In one approach, a sensing material may be disposed on the sensor antenna to alter the impedance response of the sensor. In another approach, a complementary sensor may be attached across an antenna and an optional memory chip. The complementary sensor may be used to alter sensor impedance response. Non-limiting examples of such sensors are described in U.S. Pat. No. 7,911,345 entitled "Methods and systems for calibration of RFID sensors", which is incorporated herein by reference.

As used herein the term "sensing materials and sensing films" includes, but is not limited to, materials deposited onto the RFID sensor to perform the function of predictably and reproducibly affecting the complex impedance sensor response upon interaction with the environment. For example, a conducting polymer such as polyaniline changes its conductivity upon exposure to solutions of different pH. When such a polyaniline film is deposited onto the RFID sensor, the complex impedance sensor response changes as a function of pH. Thus, such an RFID sensor works as a pH sensor. When such a polyaniline film is deposited onto the RFID sensor for detection in gas phase, the complex impedance sensor response also changes upon exposure to basic (for example, NH3) or acidic (for example HCl) gases. Sensor films include, but are not limited to, polymer, organic, inorganic, biological, composite, and nano-composite films that change their electrical and or dielectric property based on the environment that they are placed in. Non-limiting additional examples of sensor films may be a sulfonated polymer such as Nafion, an adhesive polymer such as silicone adhesive, an inorganic film such as sol-gel film, a composite film such as carbon black-polyisobutylene film, a nanocomposite film such as carbon nanotube-Nafion film, gold nanoparticle-polymer film, metal nanoparticle-polymer film, electrospun polymer nanofibers, electrospun inorganic nanofibers, electrospun composite nanofibers, and any other sensor material. In order to prevent the material in the sensor film from leaking into the liquid environment, the sensor materials are attached to the sensor surface using standard techniques, such as covalent bonding, electrostatic bonding and other standard techniques known to those of ordinary skill in the art.

As used herein, the term "environmental parameters" refers to measurable environmental variables within or surrounding a multivariable sensor. In certain embodiments, the measurable environmental variables may include one or more of physical, chemical or biological properties. Non-limiting examples of the environmental parameters may include temperature, pressure, material concentration, conductivity, dielectric property, and number of dielectric, metallic, chemical, or biological particles in the proximity or in contact with the sensor, dose of ionizing radiation, light intensity, or combinations thereof.

As used herein, the term "analyte" refers to a substance that includes any desirable measured environmental parameter. As used herein, the term "interference" includes any undesirable environmental parameter that undesirably affects the accuracy and precision of measurements with the sensor. As used herein, the term "interferent" refers to a fluid or an environmental parameter (e.g., temperature, pressure, light, etc.) that may produce an interference response by the sensor. As used herein, the term "resonance impedance" or "impedance" refers to measured sensor frequency response around the resonance of the sensor from which the sensor "spectral parameters" are extracted.

In embodiments where the sensing material is disposed on the sensor antenna, any changes in the sensing material may affect the sensor response. In one embodiment, an antenna is made at least in part from the sensing material that is responsive to environment. In this embodiment, the antenna is sensitive to the environment and may sense one or more of a chemical, biological or physical parameters. In one embodiment, the whole antenna is fabricated from a environmentally sensitive material. Depending on the application of the sensor, antenna material is different. For example, for corrosion monitoring, nonlimiting examples of antenna material are aluminum, copper, and steel. For chemical and biological monitoring, nonlimiting examples of antenna material are polyaniline, composite core-shell nanoparticles, ligand-coated nanoparticles, bare nanoparticles, nanowires, nanotubes, and nanosheets.

By applying a sensing material onto the resonant antenna of the RFID tag and measuring the complex impedance of the RFID resonant antenna, impedance response may be correlated to the biological or chemical or physical parameters. In certain embodiments, the sensitive material may undergo a detectable change upon exposure to trace concentrations of an analyte. In these embodiments, the trace concentrations may be measured by disposing the sensing material between the electrodes that constitute the resonant circuit. Thus, dielectric, dimensional, charge transfer, and other changes in the properties of the sensing material may be detected by the changes in the resonant properties of the circuit.

Advantageously, a resonant sensor having the sensing material is configured to provide individual responses for each tested target or the target and interferences. That is, the resonant sensor having the sensing material may provide different responses corresponding to each of the analyte. By applying a multivariate analysis (e.g., a principal components analysis), the dimensionality of the complex impedance responses for each of analytes is reduced to a single data point. This processed data is further used for quantitation of targets and their mixtures. As used herein, 'multivariate analysis' refers to an analysis of signals where one or more sensors produce multiple response signals that may or may not be substantially correlated with each other. The multiple response signals from the sensors may be analyzed using multivariate analysis tools to construct response patterns of exposures to different environmental conditions, such as, pressure or temperature. Non-limiting examples of multivariate analysis tools include canonical correlation analysis, regression analysis, nonlinear regression analysis, principal components analysis, discriminate function analysis, multidimensional scaling, linear discriminate analysis, logistic regression, or neural network analysis.

In certain embodiments, the complex impedance response of the sensor may be a multivariable response as more than one frequency may be utilized to measure sensor response across the resonance of the sensor. In certain embodiments, the complex impedance response of the sensor may be a multivariable response because more than one frequency may be utilized to measure sensor response outside the resonance of the sensor. In some embodiments, the sensor response is measured at multiple frequencies across the resonance of the sensor. For example, if the sensor resonates at about 13 MHz, the measured frequencies and associated sensor responses are measured from about 5 MHz to about 20 MHz. This multivariable response is analyzed by multivariate analysis. The multivariable response of the sensor includes the sensor's full complex impedance spectra and/or several individually measured properties, such as but not limited to, $F_p$, $Z_p$, $F_z$, $F1$, $F2$, $Z1$, and $Z2$. These and other measured properties are "spectral parameters". These properties include the frequency of the maximum of the real part of the complex impedance ($F_p$, resonance peak position), magnitude of the real part of the complex impedance ($Z_p$, peak height), zero-reactance frequency ($F_z$, frequency at which the imaginary portion of impedance is zero), resonant frequency of the imaginary part of the complex impedance ($F1$), and anti-resonant frequency of the imaginary part of the complex impedance ($F2$), signal magnitude ($Z1$) at the resonant frequency of the imaginary part of the complex impedance ($F1$), and signal magnitude ($Z2$) at the anti-resonant frequency of the imaginary part of the complex impedance ($F2$). Other parameters may be measured using the entire complex impedance spectra, for example, quality factor of resonance, phase angle, and magnitude of impedance. Multivariable response spectral parameters are described in U.S. Pat. No. 7,911,345 entitled "Methods and systems for calibration of RFID sensors", which is incorporated herein by reference.

In one embodiment, the RFID tag of the RFID sensor may be a passive tag. A passive RFID tag does not need a battery for its function and comprises a memory chip, which is connected to the reader antenna. A passive RFID tag may not need a battery for its function and comprises a memory microchip, which is connected to an antenna coil for communication with a writer/reader. The microchip may be read by illuminating the tag by a radio frequency (RF) carrier signal sent by a writer/reader. When the RF field passes through an antenna coil, an AC voltage is generated across the coil. This voltage is rectified in the integrated circuit (IC) microchip to result in a DC voltage for the microchip operation. The microchip becomes functional when the DC voltage reaches a predetermined level. By detecting the RF signal backscattered from the microchip, the information stored in the microchip may be identified. The distance between the passive tag and the writer/reader may be governed by the design parameters that include operating frequency, RF power level, writer/reader's receiving sensitivity, antenna dimensions, data rate, communication protocol, and microchip power requirements. The communication distance between writer/reader and tag is typically limited within a proximity distance because the passive tag operates with only microwatts of RF power from the writer/reader. For passive tags operating at 13.56 MHz, the read distance is typically not more than several centimeters. The typical frequency range of operation of 13.56 MHz passive RFID tags for digital ID writing/reading is from 13.553 to 13.567 MHz. The typical frequency range of operation of 13.56-MHz passive RFID sensors for sensing of environmental changes around the RFID sensor is from about 5 MHz to about 20 MHz, more preferably from 10 to 15 MHz. The requirement for this frequency range is to be able to recognize the tag with writer/reader that operates at 13.56 MHz while the sensor portion of the RFID tag operates from 5 to 20 MHz. To not exceed regulatory electromagnetic emission requirements, RFID sensors are designed to operate at low RF power levels Depositing sensing films onto passive RFID tags creates RFID chemical, biological, or physical sensors. RFID sensing is performed by measuring changes in the RFID sensor's complex impedance as a function of physical changes around the sensor. Examples of physical changes include, but are not limited to, temperature, pressure, conductivity, and dielectric properties. If the frequency response of the antenna coil, after deposition of the sensing film, does not exceed the frequency range of operation of the tag, the information stored in the microchip can be identified with a conventional RFID writer/reader. Similarly, an impedance analyzer can read the complex impedance of the antenna coil to correlate the changes in complex impedance to the chemical and biological species of interest and to physical changes around the sensor.

In addition to a sensing material, the RFID sensor may also comprise a protecting material. In certain embodiments, the protecting material may include, but is not limited to, materials that protect the sensor from an unintended mechanical, physical or chemical effect while still permitting the anticipated measurements of the fluid in proximity to or in contact with the sensor to be performed. The fluid can be a gas, a liquid, or a solid, or a tissue. For example, an anticipated measurement may include fluid conductivity measurement wherein a protecting film separates the sensor from the fluid yet allows an electromagnetic field to penetrate into fluid. In one example, the protecting material may be a paper film that is applied on top of the sensor to protect the sensor from mechanical damage and abrasion. In another example, the protecting material may be a polymer film that is applied on top of the sensor to protect the sensor from corrosion when placed in a liquid for measurements. In yet another example, the protecting material may be a polymer film that is applied on top of the sensor for protection from shortening of the sensor's antenna circuit when placed in a conducting liquid for measurements. Non-limiting examples of such protecting material used as films may comprise paper and polymeric films such as polyesters, polypropylene, polyethylene, polyethers, polycarbonate, polyethylene terephthalate, or combinations thereof.

In certain embodiments, direct measurements of the fluids in proximity to or in contact with the sensor may be performed. In these embodiments, the sensor may or may not include a protecting material on the sensing region. Measurements of the fluids may be performed by determining the complex permittivity of the fluids. The resonant sensor responds to the change in the complex permittivity of the environment. The real part of the complex permittivity of the fluid is referred to as a "dielectric constant". The imaginary part of the complex permittivity of the fluid is referred to as a "dielectric loss factor". The imaginary part of the complex permittivity of the fluid is directly proportional to a conductivity of a fluid. Measurements with a single sensor may be performed for mixtures of fluids or individual fluids. These measurements may be used to determine compositions of the fluids. In one embodiment, mixtures of the fluids may be homogeneous or heterogeneous. Non-limiting examples of the homogeneous mixtures are salt in water, ethanol in water, sugar in water, water in milk. Non-limiting examples of heterogeneous mixtures are silicone in water, oil in water, benzene in water, blood in tissue.

In certain embodiments, the sensor network may comprise two or more multivariable sensor nodes. In one embodiment, the sensor network may comprise a few hundreds to a few thousands of nodes, where each node is operatively coupled to one or more sensors. In certain embodiments, the sensor network may comprise spatially distributed sensor nodes. The sensors of the multivariable sensor nodes may be used to monitor physical or environmental conditions, such as, temperature, sound, vibration, pressure, humidity, motion or pollutants. The sensors may pass the data through the network to a central location.

In some embodiments, a multivariable sensor network may comprise a plurality of multivariable sensor nodes, where the sensor nodes are similar to each other. In some other embodiments, a multivariable sensor network may comprise a plurality of multivariable sensor nodes, where one or more multivariable sensor nodes are different from the other sensor nodes. In certain embodiments, one or more nodes may be configured to act as one or more of a physical, chemical, or biological sensor for one or more species, and other one or more nodes may be configured to act as a sensor for one or more physical parameters. In one embodiment, the chemical, biological, and physical sensors may comprise a sensing film. In one example application where the sensor network is used for sensing a temperature distribution within a storage warehouse, the network of multivariable sensor nodes may contain one or more temperature sensors. The multivariable sensor nodes may be distributed in various locations throughout the warehouse. In another example application for sensing air quality in a heating and cooling system, the network of sensors may be co-located in one physical location each with a different sensor to detect different components of air quality (temperature, humidity, carbon dioxide, volatile compounds, particulate matter, etc.)

In certain embodiments, the multivariable sensor network may comprise a wired or wireless network. The multivariable sensor network may comprise a plurality of multivariable sensor nodes, one or more data processing modules, and a data communication module. The data processing and data communication module may be operatively coupled to one or more multivariable sensor nodes of the plurality of nodes in the network. In one embodiment, the communication module may comprise a microcontroller configured to perform the data and signal processing.

In embodiments where the multivariable sensor network is a wireless sensor network, the individual sensor nodes may be arranged into wireless multivariable sensor nodes. In embodiments where the multivariable sensor network is a wired sensor network, the individual multivariable sensor nodes may be coupled using wired connection. The wired multivariable sensor network may be used for smaller size networks extended over a smaller area. Likewise, the wireless multivariate sensor network may be used for networks covering larger area. In one embodiment, the multivariable sensor network comprises a wireless communication protocol.

Advantageously, the sensor networks with gas sensor nodes may be used in applications requiring the synergistic combination of new data-generation and processing concepts with new sensor-integration concepts. The sensors of the networks may be configured to employ data-generation and processing concepts that are typically unavailable for individual sensors. Advantageously, this provides the ability for efficient sensors communications, improvement of detection accuracy through data fusion, and opportunities for automatic re-calibration of individual sensors on the network.

In certain embodiments, the multivariable sensor nodes may be configured to be integrated into a sensor network. In one embodiment, a stationary or mobile origin of the multivariable sensor nodes may enable diverse applications of the sensor networks. Significant advantages in the reliability and accuracy of the sensor network may be achieved upon an integration of the multivariable sensor nodes into a component or a system that has a pre-existing maintenance schedule that is matched to a maintenance schedule for multivariable sensor nodes. In one example, stationary multivariable sensor nodes may be used for mapping of chemical sources. In another example, mobile multivariable sensor nodes may be used for dynamic localization of chemical sources. In yet another example, the multivariable sensor nodes may be used for real-time chemical condition monitoring of goods (e.g., high-value goods) and their associated storage conditions. In another example, the multivariable sensor nodes may be used for an intelligent inventory management. In an example application, the sensor networks may be used in internet-enabled pollution monitoring server. The server may be interfaced with geographic location indicators, such as but not limited to, Google Maps, Yahoo Maps, Bing Maps, to display in real-time concentration levels of pollutants along with the locations, e.g., within a large metropolitan area.

In certain embodiments, the wireless sensor networks may be used to monitor large remote areas. In one embodiment, the sensor networks may be wearable wireless sensor networks to monitor, for example, athletes, medical patients, and animals. Wearable wireless sensor networks may be referred to as wireless personal sensor networks or body sensor networks. For monitoring of health and status of a person or an animal, individual sensors with their respective impedance analyzers in a single chip configuration for measurements of various parameters may be arranged on a flexible common substrate or on flexible individual substrates. In one example, the substrates of the wearable sensor networks may be flexible and stretchable.

In certain embodiments, multivariable sensors and their respective impedance analyzers in a single chip configuration may be disposed on a flexible common substrate. Such multivariable sensors having a single chip configuration, may be implemented for measurements of different parameters, such as but not limited to, physiological parameters, including blood glucose, oxygen saturation, systolic blood pressure, diastolic blood pressure, electromyogram, electrocardiogram, heart rate, respiration rate, body temperature, skin temperature, skin conductivity, or combinations thereof.

In some embodiments, impedance analyzers having single chip configuration may be configured to be implanted in a subject. In one example, the single chip configuration impedance analyzers having at least one sensor may be implantable. In certain embodiments, one or more of such impedance analyzers may be implanted in subjects, such as living beings, or non-living objects. By way of example, the impedance analyzers may be implanted in subjects and fluids such as but not limited to, animals (e.g., fish), humans, soil (e.g., outdoor soil, or soil in indoor plants), industrial infrastructure, components, or combinations thereof. Impedance analyzers in a single chip configuration with at least one sensor may be implanted in different objects, articles, items, humans, animals, and fish for real-time in-vivo monitoring of chemical, biological, and physical parameters. Non-limiting examples of implanting or incorporation of impedance analyzers in a single chip configuration with at least one sensor into an industrial or consumer infrastructure or components may include stationary industrial infrastructure, moving industrial infrastructure, roads, buildings, bridges, vehicles, wind power turbines, wind power turbine blades, aircraft engines, single-use and multiple use bioprocess components, oil drill bits, pipelines, consumer products, wireless computers, mobile computers, cradles of mobile devices, cases of mobile devices, cases of goods, smartphones, tablets, personal digital assistants, watches, industrial remote control units, consumer remote control units, television remote control units, home remote control units, home appliances, consumer appliances, clothing, footwear, helmets, sports equipment, laboratory equipment, laboratory analytical instrumentation, filters, filter cartridges, separators, separation columns, purification columns, containers, reactors, and other articles and items. The operating temperature of the impedance analyzers in a single chip configuration can range from −85 degrees Celsius to 380 degrees Celsius.

In one embodiment, the implanting or incorporation of impedance analyzers in a single chip configuration with at least one sensor into an infrastructure or a component is performed so that the impedance analyzers are implanted or incorporated without the change of their location during the measurements.

In one embodiment, the implanting or incorporation of impedance analyzers in a single chip configuration with at least one sensor into an infrastructure or a component is performed so that the impedance analyzers are implanted or incorporated so they have the ability to change their location during the measurements, for example, when they are freely dispersed into a reactor, a container, a blood vessel, a pipeline, or a vessel.

In one embodiment, the impedance analyzers in a single chip configuration with at least one sensor may be configured for single-channel measurements and for multi-channel measurements. In a single-channel measurement, one impedance analyzer measures response from a single sensor. In a multi-channel measurement, one impedance analyzer measures responses from several sensors where the sensors provide responses of the same nature (for example, the complex permittivity of the fluid) or of different nature (for example, pressure, conductivity, temperature, pH, glucose). Responses of the same or different nature may be further implemented to build a tomographic representation of the fluid sample in contact or in proximity to sensors.

In certain embodiments, the sensor networks may be employed in data-generation and processing applications, and sensor-integration applications, or both. In the area of data-generation and processing, the sensor networks may facilitate implementation of available infrastructure for communications of sensors. In one embodiment, the detection accuracy in such applications may be enhanced by using heterogeneous sensors in combination with multi-parameter coincidence techniques to improve the detection accuracy. In one embodiment, the wireless sensor networks may comprise fusion and processing strategies for massive and dynamic data from the sensor networks for time-critical decision-making and for providing ability to identify spurious signals and malfunction of individual sensors on the network. In addition, the sensor networks may comprise data acquisition algorithms for individual sensors to reduce power consumption and to extend operational lifetime before battery replacement. The sensor networks may also facilitate auto-calibration methods for maintenance-free operation of individual gas sensors in the network. In one embodiment, the responses of the sensors of the network may be calibrated with respect to local reference monitoring stations.

A topology of the sensor network may comprise one or more architectures. In certain embodiments, the topology of the sensor network may comprise a star architecture, mesh architecture, or ad-hoc architecture. In one embodiment, the architecture may be selected based on the physical, temporal and computational attributes of the application. In one example, a star architecture may be employed when there are relatively few multivariable sensor nodes in close proximity to a central host. The host may provide the ability to the nodes to deterministically communicate with each of the nodes in the star architecture. A deterministic communication for concurrent processes means that certain timing restrictions are applied on the communications, particularly where message streams are merged. In another example, a mesh architecture may be employed where there are nodes spread over a larger area without a central bus or host. The nodes may be configured to relay messages from other nodes in a non-deterministic manner depending on which nodes in the network are able to see the other nodes.

In the case of a star network, the star network may use a routing or flooding propagation technique. In one embodiment, the star network may be a centralized network. The star network may comprise a node hub in the center of the network which may be configured to act as a gateway node to collect and distribute data. Suitable network architecture (e.g., star) may be preferred over another network architecture (e.g., mesh or ad-hoc) based on the actual application of the sensors. In the case of a mesh network, a given node may be configured to communicate with any other node in the network.

In certain embodiments, the sensor network is a self-organizing network. Advantageously, the self-organizing networks provide the reconfigurability feature in wireless sensor nodes by enabling sensor devices to be self-aware, self-reconfigurable, and autonomous. In some embodiments, the self-organizing network may be designed using sensor nodes which are configured to form a wireless network spontaneously, assemble the network by themselves, dynamically adapt to device failure and degradation, manage mobility of sensor nodes, react to changes in task and network requirements, or combinations thereof. In some embodiments, the topology of the network may be defined by the physical location of the nodes and the range of their radio transmitter.

In one non-limiting example, the self-organizing network may include wireless multi-hop ad hoc networks. The wireless multi-hop ad hoc networks are networks which are set up on-the-fly. The wireless multi-hop ad hoc networks may be set up using a set of wireless devices. In one embodiment, all nodes of the self-organizing network may be functionally equal and there may be no central control or overview. In another example, the self-organizing networks may include Peer-to-peer networks, in these networks; the sensor nodes may join and leave the network at any time and may directly exchange information through a distributed and self-organizing process.

In certain embodiments, the sensor network has a self-healing capability. Self-healing capability provides a network the ability of effectively combating coverage, routing holes and network disconnection. In some embodiments, the self healing network is configured to support transfer of messages across multiple nodes efficiently, while protecting against node or process failures. It is usually designed on top of a scalable and fault tolerant protocol.

FIG. 1 illustrates a multivariable resonant sensor 10. The sensor comprises a passive sensor. The passive sensor may comprise a RFID sensor having integrated circuit (IC) memory chip 11 disposed on a substrate 12 forming radio-frequency identification (RFID) sensor when at least a portion of the antenna circuit 14 is covered with a sensing film 16.

Figure 2:
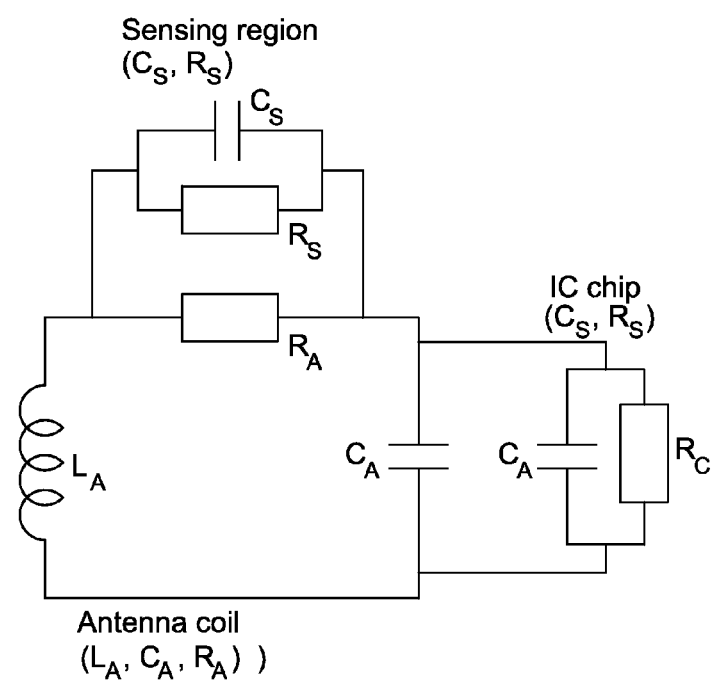
FIG. 2 is an equivalent electrical circuit of the multivariate resonant sensor with an integrated circuit memory chip, in accordance with embodiments of the present technique.

FIG. 2 illustrates an equivalent circuit of the sensor of FIG. 1. The sensor forms an inductor-capacitor-resistor (LCR) circuit and is described by the inductance $L_A$, capacitance $C_A$, and resistance $R_A$ of the sensing antenna coil, capacitance $C_S$ and resistance $R_S$ of the sensing region, and capacitance $C_C$ and resistance $R_C$ of the integrated circuit (IC) chip. Reading and writing of digital information into the RFID sensor is performed using a digital component of sensor reader. In the illustrated embodiment, measurement of an impedance of the sensor antenna may be performed using an impedance analyzer component of the sensor reader.

Figure 3:
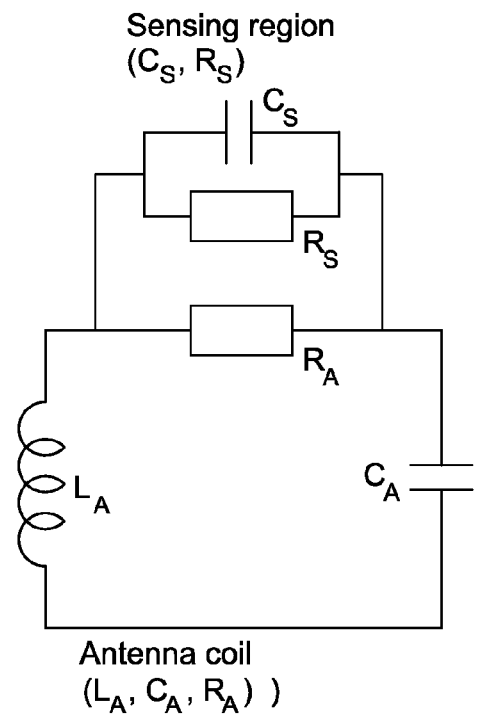
FIG. 3 is an equivalent electrical circuit of the multivariate resonant sensor without an integrated circuit memory chip, in accordance with embodiments of the present technique.

FIG. 3 illustrates an equivalent circuit of the sensor of FIG. 1 without the IC chip. The sensor forms an inductor-capacitor-resistor (LCR) circuit and is described by the inductance $L_A$, capacitance $C_A$, and resistance $R_A$ of the sensing antenna coil, and capacitance $C_S$ and resistance $R_S$ of the sensing region.

The combination of components of the sensor circuit may result in the generation of an impedance response formed by resonant circuit parameters such as $F_p$, $Z_p$, $F_1$, $Z_2$ and any other circuit parameters generated from the RFID tag of the RFID sensor. In one example, the sensor response of the resonant sensor 10 may be a multidimensional response including the combination of (1) a sensing material with different response mechanisms to different chemicals of interest, with (2) a multivariate output transducer. In certain embodiments, the sensor 10 may comprise a multidimensional sensor response. The multidimensional sensor response may include any detectable change in the sensing material properties or sensing material and antenna interface effects.

Figure 4:
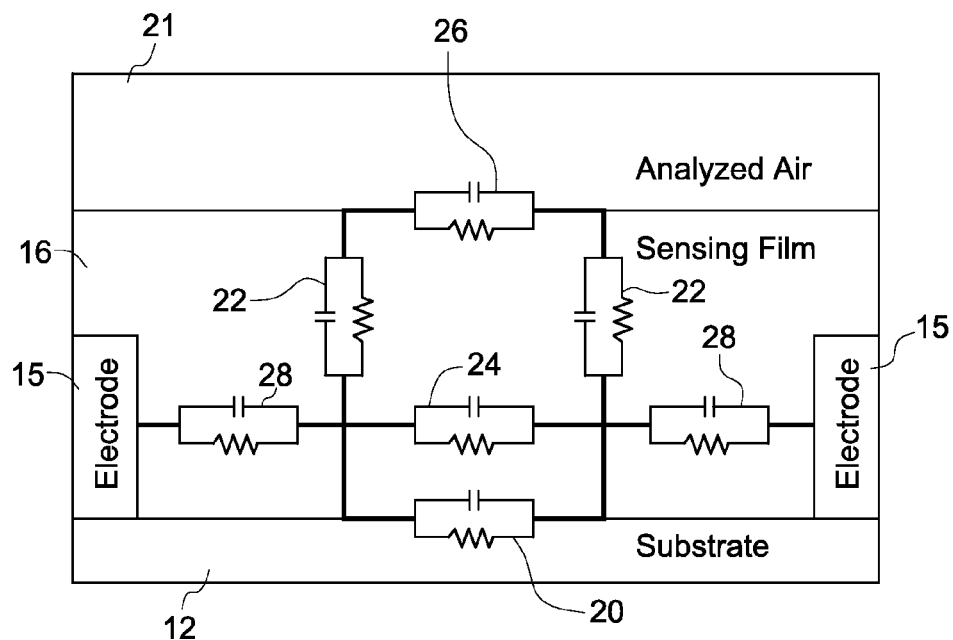
FIG. 4 is a portion of an equivalent electrical circuit of the multivariate resonant sensor of FIG. 1, in accordance with embodiments of the present technique.

A sensing portion of the multivariable resonant sensor 10 of FIG. 1 may be generally represented by an equivalent electrical circuit of FIG. 4. In the illustrated embodiment, an inductor-capacitor-resistor (LCR) resonator structure model of the sensor 10 of FIG. 1 is provided. The substrate 12 and the sensing film 16 interface is represented by the resistor-capacitor circuit generally represented by the reference numeral 20, the bulk thickness of the sensing film is represented by the resistor-capacitor circuit 22, the film bulk between electrodes is represented by the resistor-capacitor circuit 24, the interface of the sensing film 16 and air 21 is represented by the resistor-capacitor circuit 26, the sensing film 16 and contact between the electrodes 15 of the antenna 14 is represented by the resistor-capacitor circuits 28.

Figure 5:
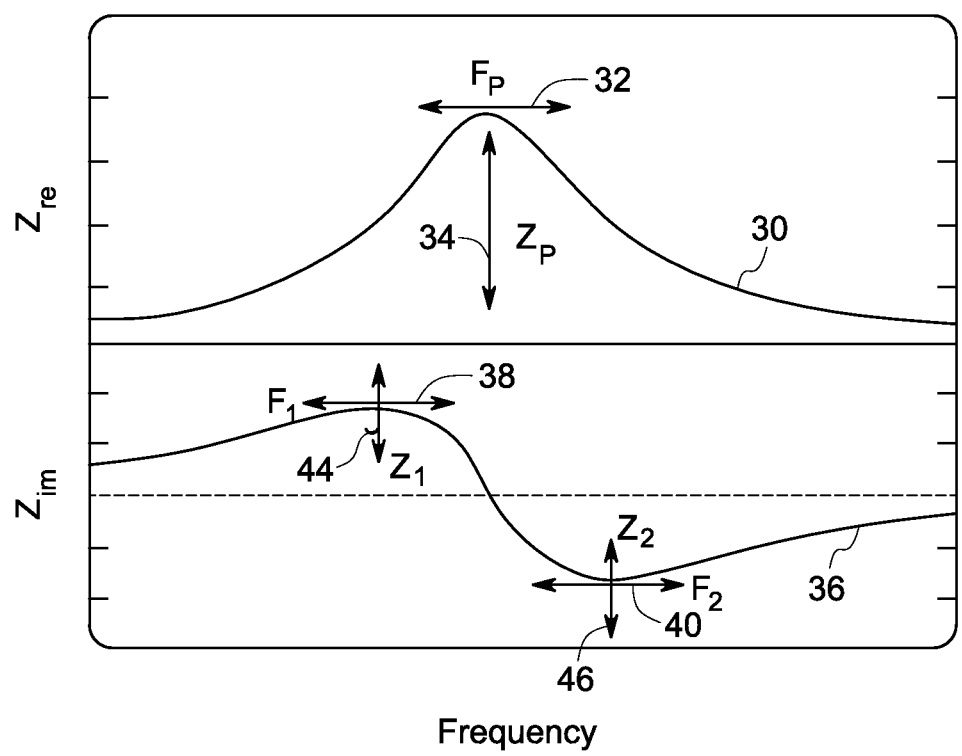
FIG. 5 is a graph of measured impedance parameters of an embodiment of the resonant sensor, in accordance with embodiments of the present technique.

FIG. 5 illustrates examples of real and imaginary portions of the impedance response spectrum of the sensor. As illustrated by the curve 30, the real part of the impedance includes spectral parameters $F_p$ 32 and $Z_p$ 34. The parameter $F_p$ 32 represents the frequency of the maximum of the real part of the impedance, and the parameter $Z_p$ 34 represents the magnitude of the real part of the impedance. Similarly, as illustrated by the curve 36, the imaginary part of the impedance includes $F_1$ 38, $F_2$ 40, Fz 42, $Z_1$ 44, and $Z_2$ 46. The parameter $F_1$ 38 represents resonant frequency of the imaginary part of the impedance, and the parameter $F_2$ 40 represents anti-resonant frequency of the imaginary part of the impedance. The parameters $F_1$ and $F_2$ are related to different components of the equivalent circuit. The parameter $Z_1$ 44 represents signal magnitude at the resonant frequency of the imaginary part of the complex impedance $F_1$ 38. The parameter $Z_2$ 46 represents signal magnitude at the anti-resonant frequency of the imaginary part of the complex impedance $F_2$ 40. The parameter Fz 27 represents the zero-reactance frequency. Additional non-limiting examples of the sensor parameters include parameters that can be extracted from the response of the equivalent circuit of the RFID sensor, the quality factor of resonance, phase angle, and magnitude of impedance of the resonance circuit response of the RFID sensor, and others known in the art. The difference between $F_1$ 38 and $F_2$ 40 is related to peak width. In this example, since $F_1$ 38 and $F_2$ 40 are related to different components of an equivalent circuit, $F_1$ 38 and $F_2$ 40 are not correlated. Peak symmetry may be affected by changes in impedance. Other parameters can be measured using the entire impedance spectrum, for example, using the quality factor of resonance, phase angle, and magnitude of impedance.

In one embodiment, the impedance analyzer may be configured to measure a complex resonant impedance (represented by Eq. (1)) of the sensor.

$$\check{Z}(f) = Z_{re}(f) + j\, Z_{im}(f) \qquad \text{Eq. (1)}$$

$F_1$ and $Z_1$ originate from inductive resonance while $F_2$ and $Z_2$ originate from capacitive resonance. The spectral parameters shown in FIG. 5 originate from several independent regions of the film/transducer system including resistance and capacitance of the sensing film, contact resistance and capacitance of the film/electrode interface and others shown in FIG. 4, as well as controlled variation in the sensor inductance and the mutual coupling coefficient of the sensor to the reader upon inductive readout.

Figure 6:
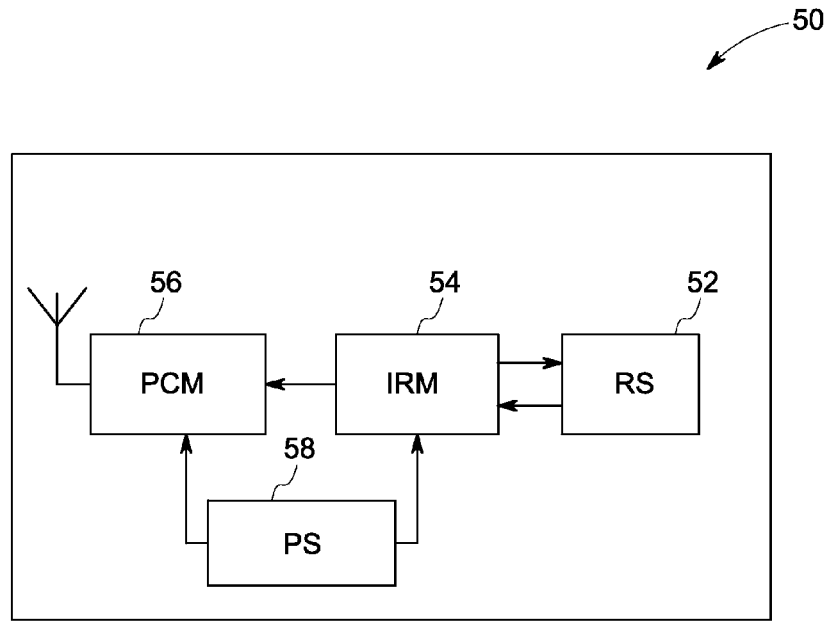
FIG. 6 is a block diagram representing an example multivariable sensor node, in accordance with embodiments of the present technique.

In one example, the impedance analyzer may measure the complex impedance of the sensor via a galvanic contact between the sensor and the reader when both are integrated into an integrated structure. In another example, the impedance reader may measure the complex resonant impedance of the sensor via inductive coupling between the passive sensor and the reader when the reader is integrated into a mobile or a stationary component. In one example, the impedance analyzer is a single-chip the impedance analyzer and is a part of a multivariable sensor node. FIG. 6 illustrates a block diagram for an example multivariable sensor node generally represented by the reference numeral 50. The multivariable sensor node 50 may be a wireless or wired multivariable sensor node. The multivariable sensor node 50 may comprise a resonant sensor (RS) 52, an impedance analyzer or an impedance reader module (IRM) 54, a processing and communication module (PCM) 56, and a power supply (PS) 58. In certain embodiments, the multivariable sensor node 50 may comprise a modular design. Advantageously, the modular design of the multivariable sensor node 50 provides the flexibility for system upgrades. In one example, the IRM 54 may communicate to the PCM 56 using a standard interface such as SPI, I²C, etc. Non-limiting examples of such PCM 56 may comprise a Texas Instruments MSP430 microcontroller in combination with a Texas Instruments CC2420 radio transceiver. In one example, the PCM 56 may be upgraded using a single chip (Texas Instruments CC430) which combines the microcontroller and radio functions but is still accessible from the IRM 54 through the same SPI interface. In one embodiment, impedance may be measured by stepping up the excitation frequency over 5-30 MHz. At each frequency step, the IRM 54 may apply a voltage excitation signal to the sensor, and perform the measurement and digitization of the resultant current signals. The digitized samples of the current data may be transferred to the PCM 56 to calculate the complex impedance value at the frequency of interest through FFT operation. In one embodiment, the broadband frequency response of the sensor may be generated by aggregating the single frequency impedance measurements. The multivariable sensor node 50 may be configured to transfer the resultant impedance data to a central hub or to a smartphone or a mobile computer for further processing.

Figure 7:
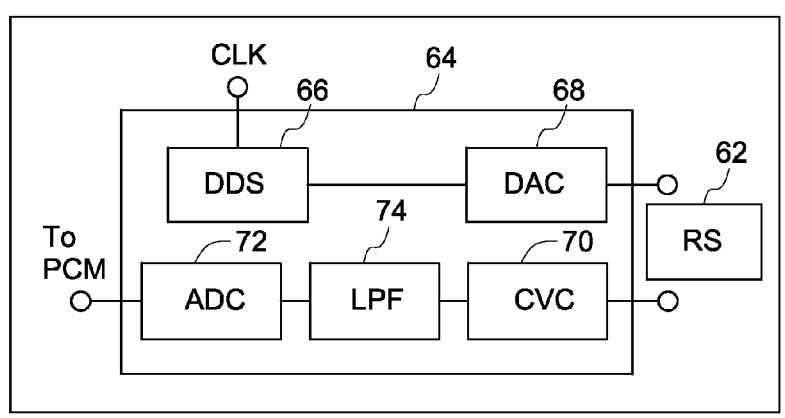
FIG. 7 is a block diagram of an impedance analyzer and resonant sensor where the impedance analyzer is integrated into a single-chip to form a resonance impedance reader module, in accordance with embodiments of the present technique.

FIG. 7 illustrates a block diagram of an impedance analyzer and resonant sensor integrated into a single-chip to form an impedance reader module (IRM) 60. The impedance reader module 60 is configured to measure a complex impedance of the resonant sensor 62. In the illustrated embodiment, the impedance reader comprises an impedance analyzer 64 having a voltage excitation generator containing a direct digital synthesizer (DDS) 66 and a voltage-mode digital to analog converter (DAC) 68, a receiver comprising a trans-impedance amplifier, also known as a current to voltage converter (CVC) 70, and analog to digital converter (ADC) 72; and optionally one or more filters 74. The DDS 66 generates the digital representation of the excitation carrier frequency which is converted by the DAC 68 to an analog voltage signal applied to the resonant sensor 62. The CVC converts the current flowing through the resonant sensor 62 into a voltage which is digitized by the analog to digital converter 72.

The impedance reader module 60 can measure the frequency response of the resonant sensor over a relatively narrow frequency range, for example from 5 MHz to 30 MHz, from 100 MHz to 500 MHz, from 1 GHz to 10 GHz. The impedance reader module 60 can also measure the impedance response of the sensor or sensors or a fluid or a structure in contact with the impedance reader module 60 over a relatively broad frequency range, for example from 1 Hz to 30 MHz, from 1 MHz to 1 GHz, from 0.1 GHz to 100 GHz.

In one embodiment, the size of the single-chip impedance reader is 10 mm×10 mm×2 mm. In one embodiment, the consumed power is 5 mW using IC design principles, thus providing more than 100-fold reduction in power consumption from the 660-mW discrete component handheld battery-operated reader. In one embodiment, the power consumption is further reduced by operating the system with a less than 100% duty cycle. The single-chip impedance reader may be configured to act as a multivariable sensor node in a wired or wireless sensor network.

In certain embodiments, the resonance impedance reader may be implemented as a part of a stand-alone multivariable sensor node in a wired or wireless sensor network. In certain other embodiments, the resonance impedance reader may be integrated into a smartphone, a smartphone cradle, or a mobile computer. Advantageously, the resonance impedance reader may facilitate improved measurement response with high input impedance (4.7 kOhm load impedance versus standard 50 Ohm impedance), improved direct measurement of voltage and current through differential amplification, reduced power consumption due to the use of active RF mixers and passive phase splitters, and digital signal processing that reduced the number of components needed in the current design. The single-chip resonance impedance reader also eliminates the board-level component design enabling more than 10-fold reduction in power consumption and size.

Figure 8:
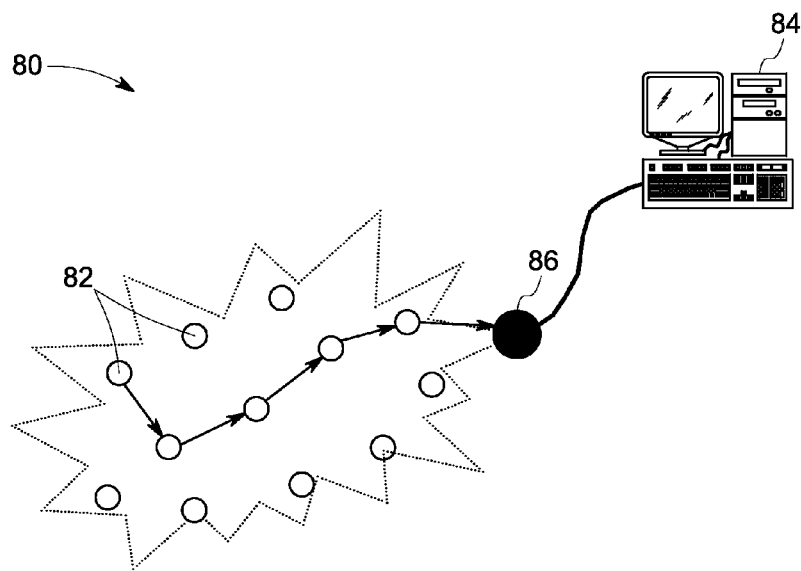
FIG. 8 is a schematic representation of a sensor network comprising multivariable sensor nodes, in accordance with embodiments of the present technique.

FIG. 8 illustrates a sensor network 80 comprising multivariable sensor nodes 82. In one embodiment, the multivariable sensor nodes may be communicatively coupled to a central hub 84 or a smartphone or a mobile computer for further processing. In some embodiments, the multivariable sensor nodes 82 may communicate uni-directionally to provide data to the central hub 84 or smartphone or a mobile computer. In other embodiments, the multivariable sensor nodes 82 may bi-directionally communicate with the central hub or smartphone to increase confidence in the data transmission (using acknowledgements and retransmissions) or to provide reconfiguration instructions for the multivariable sensor node.

In some embodiments, one or more multivariable sensor nodes may have the capability to operate as a gateway node 86. In certain embodiments, a central hub or central computing center 84 or smartphone may act as a gateway to transmit data to other local or remote networks such as WiFi or cellular networks.

In one embodiment, the multivariable sensor nodes 82 may provide sensor information to a central computing center 84 using wireless communication. The multivariable sensor nodes 82 may be in communication with the central computing center via a network for processing the digital and analog data. The central computing center 84 may be directly or indirectly coupled to one or more multivariable sensor nodes (or neighboring sensors). In this way, the multivariable sensor node may advantageously have access to information provided by other sensors. The sensors of neighboring multivariable sensor nodes may measure same or different environmental parameters. Non-limiting examples of a central computing center include a central hub or a cloud-computing cluster. As used herein, the term "cloud computing" may encompass internet-based computing, whereby shared resources, software and information are provided to computers and other devices on-demand. In certain embodiments, a central processor might be used to generate detailed response models. Cloud computing may reduce the cost and capital expenditure. In addition, cloud computing may provide location independence by enabling the users to access the systems using a web browser regardless of their location or what device they are using (e.g., personal computer, or mobile). In one example, a cloud computing cluster may allow a user or automated system to dynamically evolve the model based on, for example, changing ambient noise parameters. Non-limiting examples of such ambient noise parameters may include temperature, humidity or pressure. Values of ambient noise parameters may be provided from the same or different sensors. The detailed response model may evolve based on neighbor multivariable sensor nodes that provide similar types of sensing information or different sensing information about other measured parameters.

In certain embodiments, one or more nodes 82 of the network 80 may be interconnected to one or more nodes 82 of the network 80. In some embodiments, one or more nodes may have artificial intelligence to make decisions in near real time. For example, determining what parameters processes to monitor and control, databases to access, data to send to other nodes, data to accept from other nodes, data transformation and analytics to perform, reports to generate. In one embodiment, the multivariable sensor node is configured to perform distributed computation (wired or wireless) using the networked devices such as mobile computers, smartphones, tablets, personal digital assistants (PDAs), networked watches, or any other devices.

In certain embodiments, the multivariable sensor node may be integrated in an existing device connected to the network. Non-limiting examples of such devices may include smartphone, tablet, PDA, or any other device that may be configured to transmit and receive data using a network. In some embodiments, the multivariable sensor node is integrated into an auxiliary component (such as cradle, case, separate housing, etc.) of smartphone, tablet, PDA, or any other networked device. In one embodiment, the multivariable sensor node communicates by wired connection to the smartphone, tablet, PDA, or any other networked device. In another embodiment, multivariable sensor node communicates by wireless connection to the smartphone, tablet, PDA or any other networked device. In one embodiment, a sensor node is integrated into a portable or wearable computer-power enabled device that is networked or not networked.

Figure 9:
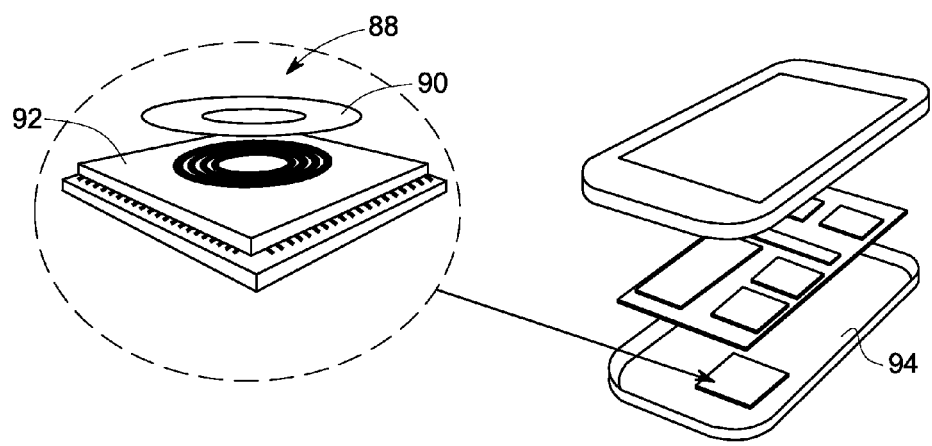
FIG. 9 is a schematic representation of an impedance analyzer that is integrated with an existing device connected to the network, and measures multivariable sensor response in accordance with embodiments of the present technique.

As illustrated in FIG. 9, an example multivariable sensor node 88 having a resonant sensor 90 and an impedance analyzer 92 is integrated in a smartphone cradle 94.

In one embodiment, a sensor node may be powered by a battery, supercapacitor, energy harvesting device. In one embodiment, a sensor node is powered wirelessly. In one embodiment, the power source is internal within the multivariable sensor node and is a battery, or an energy-storage device, or an energy-harvesting device, or a combination thereof. Different types of energy harvesting devices provide the ability to harvest different amounts of energy. For example, the harvested power from ambient indoor and outdoor light ranges from about 10 microWatt/$cm^2$ to about 100 milliWatt/$cm^2$. The harvested power from thermal sources such as humans or industrial sources ranges from about 10 microWatt/$cm^2$ to about 10 milliWatt/$cm^2$. The harvested power from various radio-frequency (RF) sources ranges from about 0.001 microWatt/$cm^2$ to about 1 milliWatt/$cm^2$. The harvested power from various vibration sources ranges from about 0.1 microWatt/$cm^2$ to about 1 milliWatt/$cm^2$. Harvested power is adequate to power the single-chip impedance analyzer device that requires 5-10 mW of power when operated with a 100% duty cycle and less than 1 mW when operated with 1-10% duty cycle. Thus, to power the multivariable sensor node, energy is harvested from the ambient environment with nonlimiting examples such as thermal energy sources, light energy sources, vibration energy sources, radio frequency energy sources, motion energy sources, and others known in the art. Also, to power the multivariable sensor node, energy is harvested wirelessly from a remote source with nonlimiting examples that include radio-frequency transmitter, light transmitter, inductive field, and others known in the art.

The harvested power from different available sources is utilized not only for operation of the single-chip impedance analyzer device, but also to provide wireless communication. The power required for the wireless communication depends on the wireless communication standard and on the indented range of communication. For example, Bluetooth® communication standard provides operation in a range from about 10 meters to about 100 meters and requires power in a range from about 2.5 mW to about 100 mW. In contrast, the Medical Implant Communication Service (MICS) communication standard provides operation over 2 meters and requires 25 microW of power.

In one embodiment, sensor design as a standalone sensor node includes a design of a radio frequency identification (RFID) sensor, operating at any frequency, for example, 120-140 kHz, 13.56 MHz, 800-990 MHz, 2.4 GHz and any other frequency.

In one embodiment, it may be desirable to minimize energy or power consumption of the sensing device, and make the sensor nodes more energy efficient, as the limited energy resource determines the lifetime of the sensor nodes. To conserve power the multivariable sensor node may be at least temporarily decoupled from the radio power supply when not in use.

Figure 10:
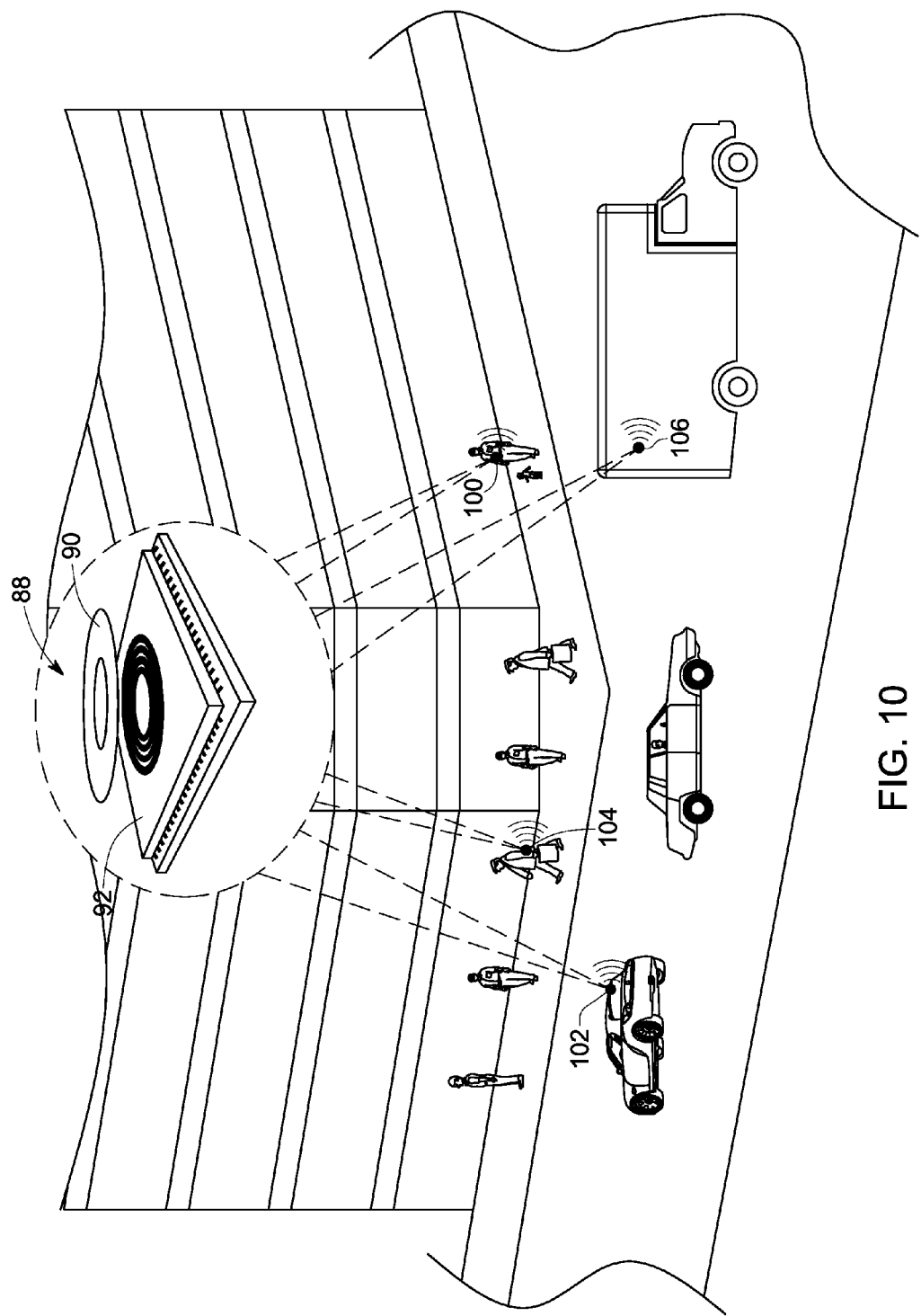
FIG. 10 is a schematic representation of an example application where a plurality of multivariable sensor nodes are integrated with networked devices, in accordance with embodiments of the present technique.

FIG. 10 illustrates an example application of an instance where the multivariable sensor nodes 100, 102, 104 and 106 are integrated with networked devices such as smartphone, PDA, a transportation vehicle. The multivariable sensor nodes 100, 102, 104 and 106 are configured to communicate with each other using the communication means of the networked devices.

Several embodiments of the application specific integrated circuit (ASIC) implementation are envisioned. Some of these are described in FIGS. 11, 13, and 15-16.

Figure 11:
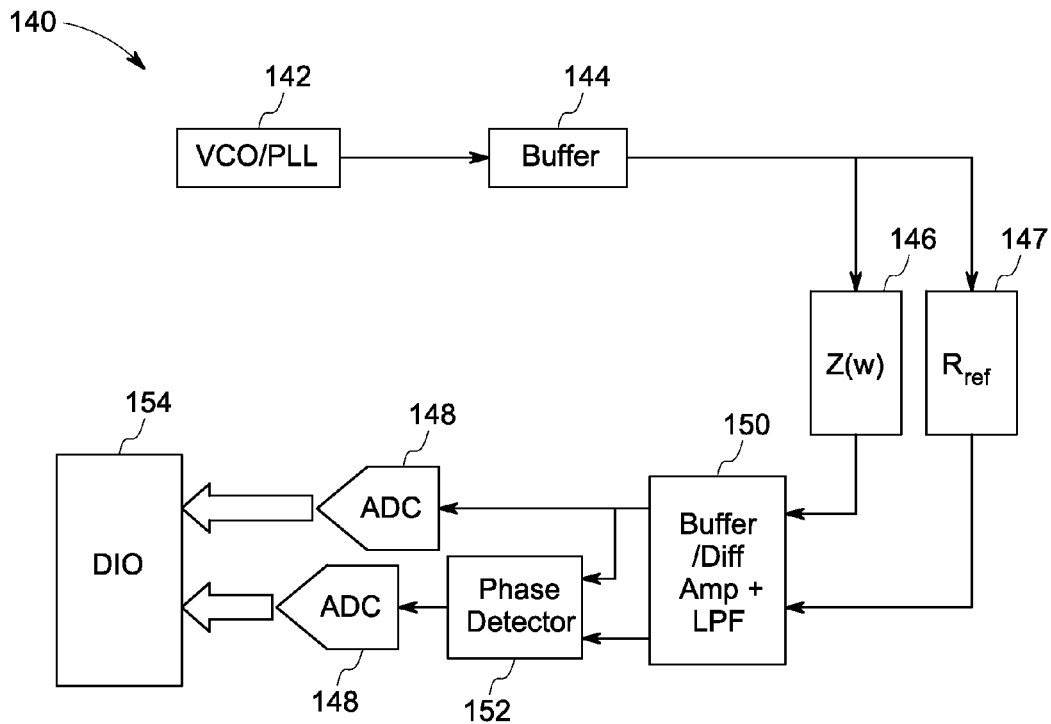
FIG. 11 is an example block diagram of a multivariable sensor node comprising a resonant multivariable sensor and an impedance analyzer, in accordance with embodiments of the present technique.

In example architecture 140 illustrated in FIG. 11, a voltage controlled oscillator phase-locked loop (VCO/PLL) 142 may be used as a swept signal source. A buffer 144 may be used to isolate different stages in the architecture 140. The amplitude and phase of the sensor 146 may be measured at the excitation frequency directly. In the illustrated embodiment, the sensor may be a resonant sensor. An reference impedance 147 may be used when the frequency of the input is far from resonance. Under these conditions, the difference between the reference and the device under test (DUT), i.e., the resonant sensor 146, are small and the analog to digital converter 148 may be used to digitize for a smaller range. The advantage of this approach is that the resolution requirements for the analog to digital converter 148 are reduced for several points on the sweep. A buffer or a difference amplifier in combination with a low pass filter, generally represented by the reference numeral 150, may be used to filter out undesirable frequencies. In one embodiment, when the difference between the reference impedance and the sensor response exceeds a threshold (usually when the frequency is close to resonance), then a full N-bit conversion may be performed using a fast Fourier transform digital signal processor (FFT/DSP) to provide an output. This leads to desirable lower power consumption in the measurement signal chain. In the illustrated embodiment, the resultant output may be passed through a phase/frequency detector 152 to provide the information on the phase. The output is then digitized and is available as a bit stream at the DIO 154. In this embodiment, measurement accuracy may be only limited by that of the amplifier and phase detector.

In one embodiment, multiple-channels of sensors may be integrated into the ASIC to monitor a network of sensors. In such an embodiment, a single PLL may be shared between all the channels reducing the overall power and area overhead of the signal source. In one embodiment, measurement accuracy may be only limited by that of the amplifier and phase detector. In one example, band-pass filters and Delta-Sigma ADCs may be used for lower power if the resonant frequency of the sensor remains in the range of several MHz.

Figure 12:
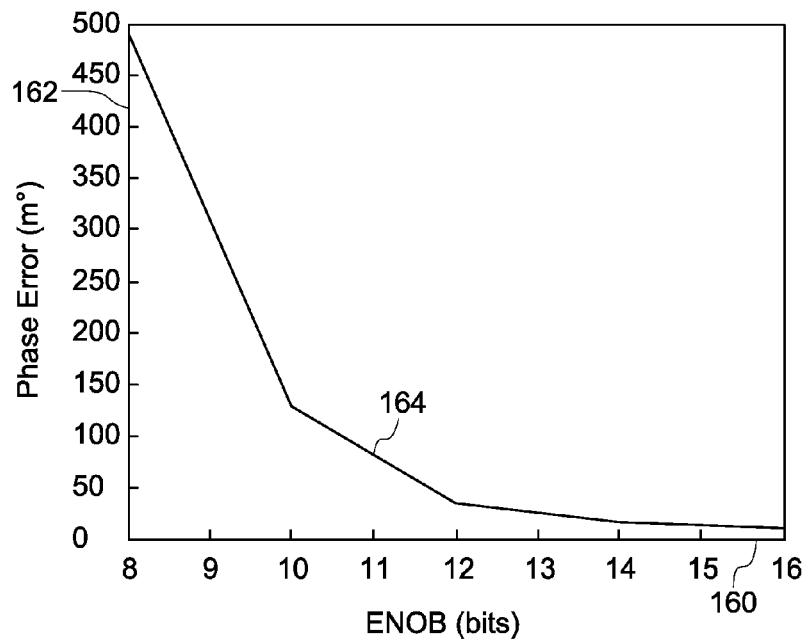
FIG. 12 is a graphical representation of a relationship between the required accuracy of the signal source and overall phase error, in accordance with embodiments of the present technique.

FIG. 12 illustrates a relationship between the required accuracy of the signal source and overall phase error. A plot of effective number of bits (ENOB) 160 of a signal source vs.

tolerable phase error 162 is shown by the curve 164. The phase error introduced by the signal source is a function of the noise of the oscillator components and can be directly obtained by the integrating the phase noise of the oscillator over the frequency of interest. In one example, LC oscillator based VCOs or low power PLLs may be used to meet the target of ~200 mdeg phase error.

Figure 13:
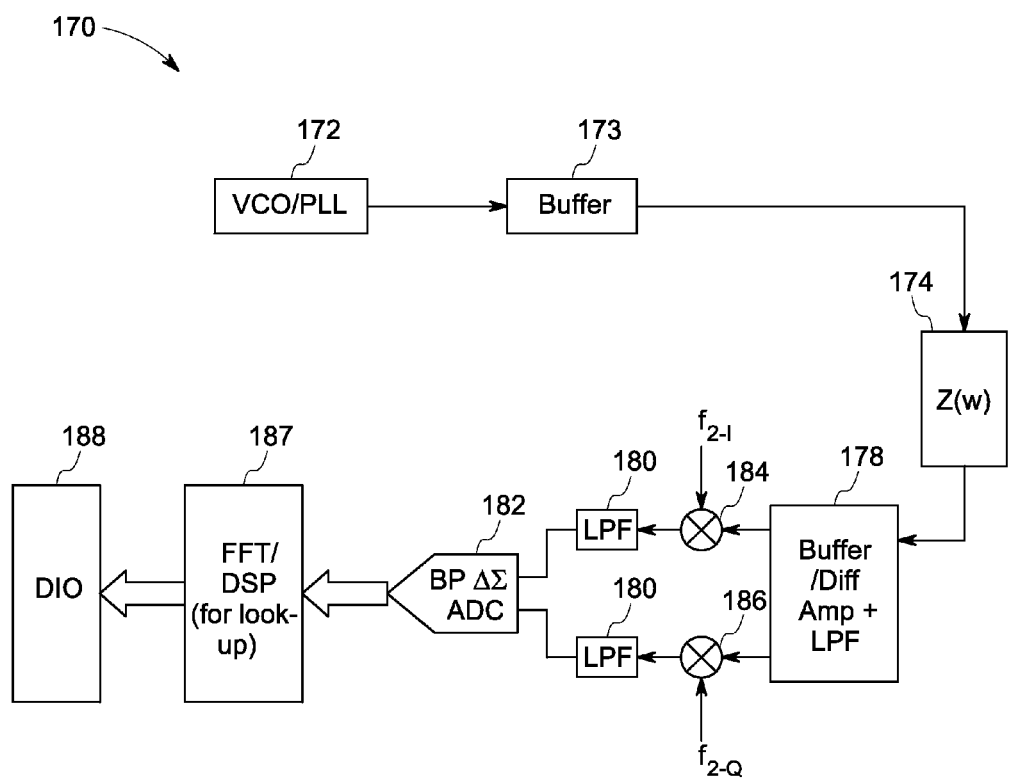
FIG. 13 is an example block diagram of a multivariable sensor node comprising a resonant sensor and an impedance analyzer, in accordance with embodiments of the present technique.

In certain embodiments, power overhead of high speed, high resolution ADC may be reduced or avoided by using a heterodyne architecture. The heterodyne architecture may down-convert the signals to baseband frequencies and use low power, high resolution converters for the same. FIG. 13 illustrates an embodiment of an example I-Q demodulated channel 170.

A VCO/PLL 172 in conjunction with a buffer 173 may be configured to serve as a signal source similar to the direct conversion architecture. When reading the signal from the sensor 174, a low noise buffer or differential amplifier 178 may be employed to increase the signal levels. The signal frequency may be down-converted to a lower frequency by mixing with a second frequency of similar magnitude to the excitation frequency by the mixers 184 and 186. The down converted signal may be subjected to low-pass filters (LPFs) 180 to at least partially reject high frequency components. Subjecting the down converted signal to the low pass filters 180, the information is available at a much lower frequency and this reduces the band-width requirements for the analog to digital converter down-stream, offering significant power savings in the signal chain. Advantageously, band-pass ΣΔ analog to digital converters 182 may be desirable in the illustrated architecture 170 due to their inherent low power at baseband frequencies. Having, two mixer frequencies 184 and 186 that are 90 degrees apart in phase, provides a measure of the phase of the signal, as it provides two signals that are in quadrature for the two variables in the measurement (e.g., amplitude and phase).

Advantageously, the architecture 170 allows the use of a low power analog to digital converter. However, addition of a mixer in the signal path poses constraints on the maximum achievable accuracy since the realization of high resolution mixers in an ASIC requires larger area and power. Hence, the mixer may also limit the accuracy of the architecture 170. As with the direct conversion technique, the PLL 172 poses an additional power overhead for a single channel system, but may not be a concern for a multi-channel embodiment. As with the previous approach of FIG. 11, reference impedance may be used to minimize the resolution requirement for the analog to digital converter. However, since the analog to digital converter is operating at lower frequencies, this may not be a concern. Instead, the reference impedance may be used to minimize the linearity requirement on the front-end amplifier.

In certain embodiments, a method of determining amplitude (|Z|) and phase (Φ)(Z)) using the architecture 170 of FIG. 13 may include applying sinusoidal reference signal, $I_{ref}$, from PLL/VCO 172. The sensor signal Z(w) or device under test (DUT) 174 provides a response to the applied signal as represented by Eq. (2).

$$V_{out} = I_{ref} * Z(w) \qquad \text{Eq. (2)}$$

The $V_{out}$ may be amplified with a differential amplifier. The differential amplifier may be used to increase the signal magnitude to improve measurement accuracy. The amplified signal may be applied as one of the two inputs to the mixer 178. The second input of the mixer is a second reference signal of frequency $w_2$. The second mixer has a reference signal of the same frequency $w_2$, but phase shifted by 90 degrees. Output of the mixer is at frequencies=$(w+w_2)$ and $(w-w_2)$. Applying this signal to the low pass filters 180, which may reject $(w+w_2)$ term leaving only $(w-w_2)$. Since the frequency is now $(w-w_2)$ and is significantly smaller than w itself, the analog to digital converter may operate at a much lower speed, hence lower power.

The signals from the two phases with analog to digital converter may be digitized. Sigma-delta modulators 182 are preferred for this purpose. The two paths (I and quadrature) provide two measurements of the signal to de-convolve amplitude and phase respectively. FFT and digital I/O (DIO) 187 and 188, respectively, may be used to provide a digital output.

Figure 14A:
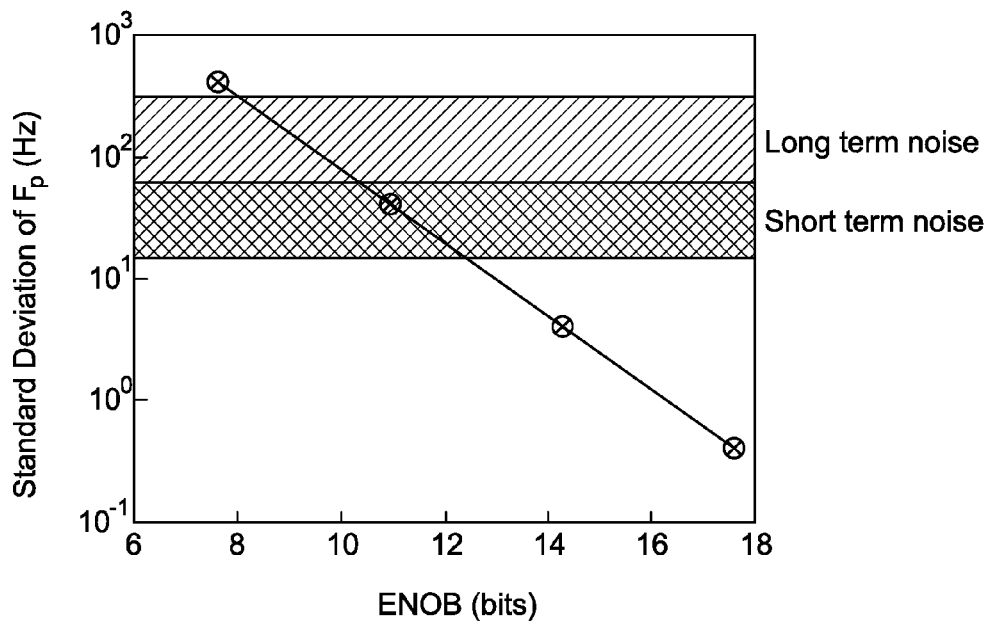
FIGS. 14a-14b are graphical representations of a comparison of simulation and experimental results of noise contributions for different effective number of bits (ENOB) of an analog to digital converter, in accordance with embodiments of the present technique.
Figure 14B:
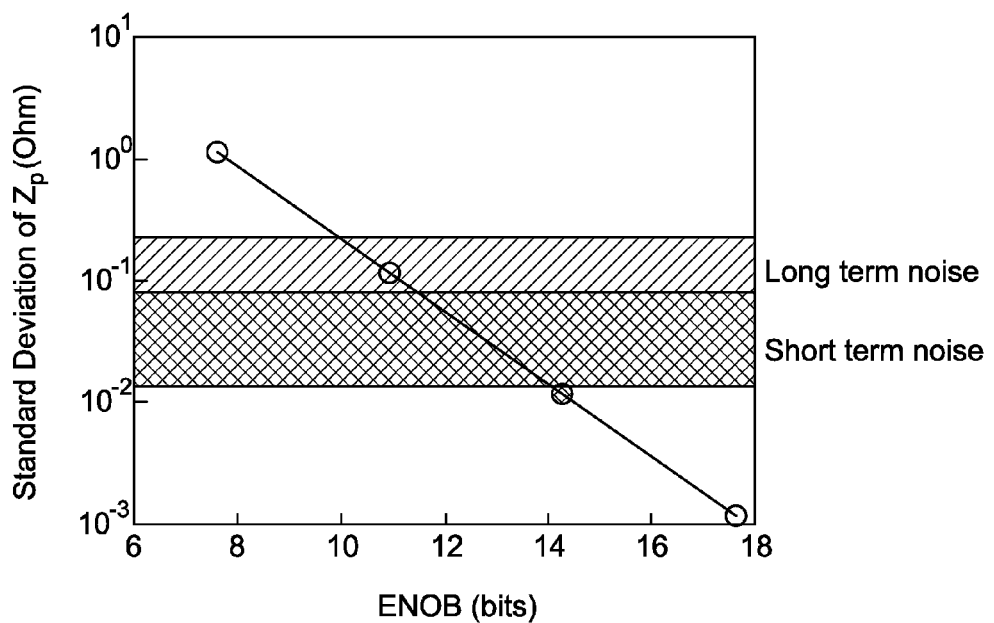

FIG. 14a and FIG. 14b illustrate a comparison of simulation and experimental (short- and long-term) results of noise contributions for different effective number of bits (ENOB) of an analog to digital converter: (A) and (B) are Fp and Zp noise levels, respectively.

One of the significant power dissipation sources in the architectures illustrated in FIG. 13 is the signal source. Unlike a general purpose impedance analyzer, the signal source may not be required in a resonant sensor. In an alternate embodiment, the sensor may be configured to define its own frequency to eliminate the need for a signal source. An example of such an embodiment is illustrated in FIG. 15.

Figure 15:
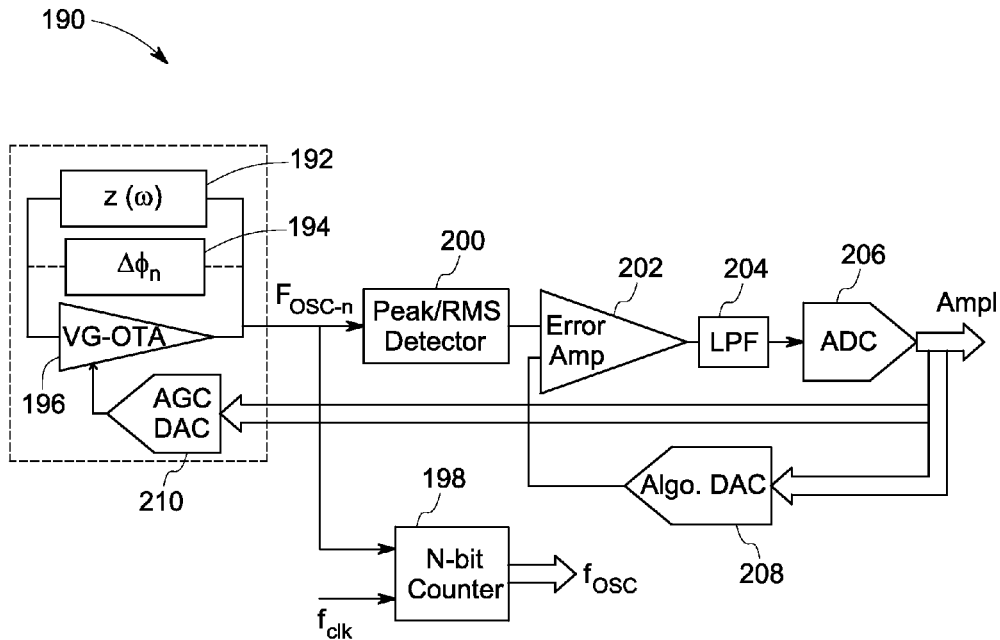
FIGS. 15 and 16 are example block diagrams of multivariable sensor nodes comprising a resonant sensor and an impedance analyzer.

In the illustrated embodiment of FIG. 15, the architecture 190 includes a sensor 192, a bank of capacitors represented by the $\Delta\Phi_n$ 194, and a variable gain amplifier (VG_OTA) 196. The VG_OTA 196 is used to lock into oscillation at the frequency defined by the sensor itself. Thus the frequency of oscillation (and hence the LC product) is directly counted with a frequency counter, N-bit counter 198. The bank of capacitors 194 may be provided in parallel with the sensor 192 to sweep frequencies and de-convolve the inductive and capacitive components.

To facilitate control of the amplitude of the excitation (which is a measurement of (|Z|), an amplitude locked loop may be employed. This amplitude locked loop may comprise a peak/RMS detector 200 and an error amplifier 202, a low pass filter 204 to remove high frequency spurious components, and a ADC-DAC combination comprising an analog to digital converter 206, and algorithmic digital to analog converter 208. The peak/RMS detector 200 is configured to detect the average amplitude of oscillation. The error amplifier 202 is configured to compare the average amplitude of oscillation and the expected value. In one embodiment, the resulting error may be used to continuously control the gain of the amplifier 202 using the algorithmic digital to analog converter 208 to define the signal amplitude accurately. Defining the signal amplitude accurately may facilitate controlling the amplitude to a high degree of accuracy, with a slow loop that requires no high speed components. A peak detector may be configured to track the peak at each cycle of oscillation and may be suitable for a faster loop settling time, at the cost of higher power consumption. On the other hand, a RMS detector may be configured to average over multiple cycles, hence, the RMS detector may be suitable for a slower settling time, and more accurate solution at lower power.

In certain embodiments, a method of determining amplitude (|Z|) and phase (Φ(Z)) of the sensor signal is provided. The method may commence by selecting one capacitor from the bank of capacitors 194. A signal may be applied to DUT (Z(w)) 192 through the amplifier VG-OTA 196. Output of the DUT (Z(w) is given by Eq. (3).

$$V_{out} = I_{ota} * Z(w) \qquad \text{Eq. (3)}$$

The peak/average value of the $V_{out}$ may be determined using the peak/RMS detector 200. The peak detector is faster but less accurate and may consume higher power. The RMS detector measures average value is slower, but more accurate. The output of the peak/RMS detector 200 is a measure of $V_{out}$. The output $V_{out}$ may be applied to the error amplifier 202. The other input of the error amplifier 202 is from an algorithmic digital to analog converter 210. In the illustrated embodiment, the $V_{out}$ may be filtered with the low pass filter 204 to reduce the noise in the output signal. In one embodiment, the $V_{out}$ information may be digitized using the analog to digital converter 206. In an alternate embodiment, low power sigma-delta converters may be used in place of the analog to digital converter 206. The output of the analog to digital converter 206 is a measure of $|Z|$.

In some embodiments, a digitized $V_{out}$ may be used in conjunction with the digital to analog converter 208 set reference level for the error amplifier 202. Advantageously, using the algorithmic digital to analog converter 208 in conjunction with the filtered peak value, a loop may be settled faster to the desirable value. In some other embodiments, a simple analog reference may be used in place of the digital to analog converter 208. However, using a simple analog reference may limit the tracking range of the loop.

An error in $I_{ota}$ results in an error in the $V_{out}$. Accordingly, in some embodiments, the error in $I_{ota}$ may be controlled. In these embodiments, the output of the analog to digital converter may act as an input to the AGC DAC 210. The AGC DAC may be used to adjust the gain of the OTA ($G_{ota}$) so that the output amplitude of the OTA ($I_{ota}$) is defined accurately. The $I_{ota-new}$ may be a product of $G_{ota}$ and $V_{out}$.

The frequency of oscillation may be measured using the N-bit counter 198 which may be configured to count the number of pulses until a reference clock resets the counter. In one embodiment, where it is desirable to sweep the frequencies, the process may be repeated by selecting a different capacitor from the bank.

Figure 16:
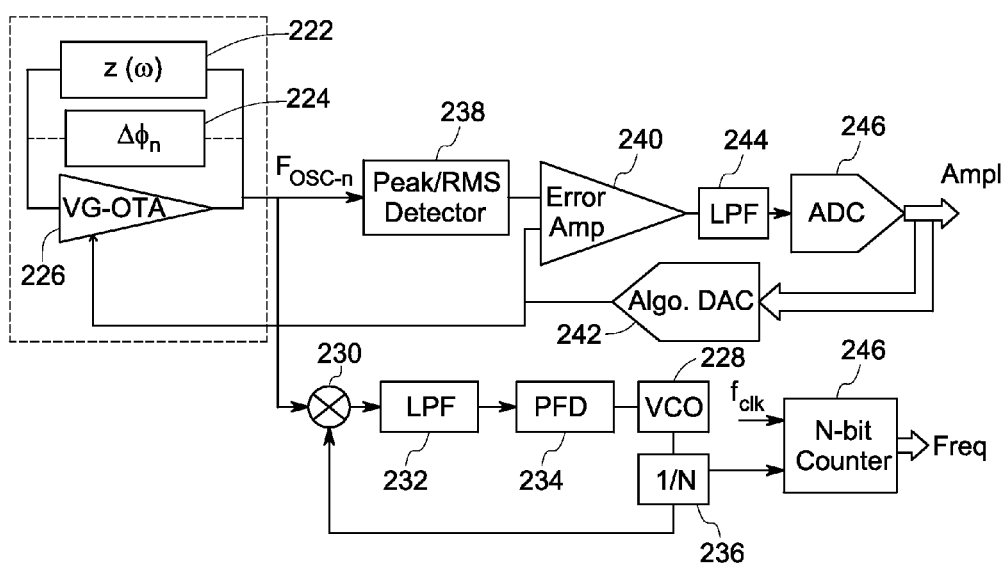

The architecture illustrated in FIG. 15 may be enhanced further by introducing a phase-locking loop (PLL) for the frequency detection as illustrated in FIG. 16. In one embodiment, the functionality of the amplitude locked loop illustrated in FIG. 16 may be the same as that of the embodiment illustrated in FIG. 15. However, a direct measurement of frequency as described in FIG. 15 may result in a relatively larger phase error than desirable in some applications that require relatively higher accuracy. In some embodiments, the phase locking loop (PLL) may be used to filter the phase error in the frequency measurement to enhance the accuracy of the same. The principle of operation of the PLL may be similar to the amplitude locking loop described in the earlier section. The oscillation frequency of the sensor may be locked to a VCO and the phase error may be filtered and used as a control signal for a VCO. The VCO frequency may be counted directly after the divider. While the additional PLL improves the frequency accuracy, it adds system complexity and power. The overall power consumption in this case may still be smaller than the direct conversion or heterodyne based approaches since there are no mixers or high speed analog to digital converters in the signal chain.

The advantage of either of these approaches is the fact that except for the amplifier (VG-OTA) in the oscillator loop, none of the components operate at high speed. Hence, high resolution and low power requirements may both simultaneously be satisfied. However, the design does involve several loops and the settling time may be slower. Overall design complexity is also higher, although each of the individual components may be easier to realize.

As will be appreciated, the direct conversion approach is the fastest, albeit the most power consuming The dual loop architecture may result in lower power dissipation owing to the lack of deployment of any high speed components, but it comes at the cost of lower speed per scan, though with higher scan accuracy.

In the illustrated embodiment of FIG. 16 the architecture 220 of the amplitude/frequency locked loop is represented. In the illustrated embodiment, the architecture 220 includes a sensor 222, a bank of capacitors 224 represented by the $\Delta\Phi_n$, and a variable gain amplifier (VG_OTA) 226. The VG_OTA 226 may be used to lock into oscillation at the frequency defined by the sensor itself. Thus the frequency of oscillation (and hence the LC product) is directly counted with a frequency counter, N-bit counter 198. The bank of capacitors 194 may be provided in parallel with the sensor 192 to sweep frequencies and de-convolve the inductive and capacitive components.

The architecture 220 may comprise a voltage controlled oscillator (VCO) 228 that may generate an output voltage at a frequency defined by a controlled voltage. This frequency defined by the controlled voltage may be compared to the frequency of oscillation with a mixer 230. The resulting output may be a sum and difference of the VCO 228 and resonant frequencies. The resultant output may be subjected to a low pass filter 232. The low pass filter 232 may reject the higher frequency component. For example, the low pass filter 232 may reject a sum frequency component. Further, the resultant output may be passed to a phase/frequency detector 234. The output of the detector 234 may be a filtered DC signal that is representative of the difference between the VCO 228 and the sensor oscillator frequencies. This control voltage is used to adjust the frequency of the VCO 228 until it is "phase locked" to the sensor frequency and the phase error in the loop reduces to zero. In one embodiment, when the frequency of the VCO 228 is adjusted and phase locked to the sensor frequency, the VCO frequency is equal to the resonant frequency and is directly counted after the divider 236.

In some embodiments, a digitally controlled oscillator (DCO) may also be disposed in place of an analog VCO. In these embodiments, the digital control input to the DCO may also be interpreted as a measure of the resonant frequency. Thus, the loop serves to reduce the phase error in the measurement of the resonant frequency to enhance the measure of the effective number of bits (ENOB).

In certain embodiments, amplitude ($|Z|$) and phase ($\Phi(Z)$) of the signal may be determined using the architecture illustrated in FIG. 16. In these embodiments, the method may commence by selecting one capacitor from bank of capacitors ($\Delta\Phi n$) 224. Next, a signal may be applied to the DUT sensor ($Z(w)$) 222 through the amplifier VG-OTA 226, and the output of the DUT ($Z(w)$) may be represented by $V_{out}$. In one embodiment, the $V_{out}$ may be a product of $I_{ota}$ and $Z(w)$. Further, peak/average value of $V_{out}$ may be measure using a peak/rms detector 238. The peak detector may be faster but less accurate and may consume higher power. However, the RMS detector may measure average value, and may be slower, and more accurate. The output of the peak/RMS detector 238 is a measure of $V_{out}$.

In one embodiment, the output, $V_{out}$, may be applied to an error amplifier 240. The other input of the error amplifier 240 is from an algorithmic digital to analog converter 242. In one embodiment, the $V_{out}$ may be filtered with a low pass filter 244 to reduce noise in the output. The $V_{out}$ information may be digitized using the analog to digital converter 246 to obtain $|Z|$. Further, low power sigma-delta converters may be used to digitize the $V_{out}$. Next, the digitized $V_{out}$ may be set in conjunction with an algorithmic digital to analog converter set reference level for the error amplifier. Advantageously, using an algorithmic digital to analog converter in conjunction with the filtered peak value, the loop may be allowed to settle faster to the desirable value. An analog reference may also be used in this case, eliminating the algorithmic digital to analog converter digital to analog converter; however, this may limit the tracking range of the loop.

An error in $I_{ota}$ may be reflected as an error in $V_{out}$. In one embodiment, $I_{ota}$ may be controlled. The output of the analog to digital converter may also act as an input to the automatic gain control digital to analog converter (AGC DAC). The AGC DAC may be used to adjust the gain of the OTA ($G_{ota}$) so that the output amplitude of the OTA ($I_{ota}$) may be defined accurately. The transfer function may be represented by Eq. (4).

$$I_{ota-new} = G_{ota} * V_{out} \qquad \text{Eq. (4)}$$

The architecture 220 may be used to measure frequency of oscillation and phase. The frequency of the output voltage, $V_{out}$ (f1), may be compared to the frequency of a second signal f2 generated by the VCO 228. The output of the mixer 230 is (f1+f2) and (f1−f2). The output of the mixer 230 may be applied to the low pass filter 232. The low pass filter 232 may remove f1+f2 and the output of the low pass filter may be f1−f2. The output f1−f2 may be applied to a phase/frequency detector 234. The detector 234 may provide an output DC voltage that may be proportional to the difference between the two frequencies.

The VCO 228 may generate a new frequency (f2−new) which may be closer to f1. The loop may continue to run, until the difference of f1 and f2 is nil, indicating that there is no phase error between the VCO 228 and the DUT 222. To obtain the LC product, the new frequency (F2−new) may be digitized by the N-bit counter 246 which counts the number of pulses until reference clock resets the counter.

In one embodiment, where it is desirable to sweep the frequencies, the process may be repeated by selecting a different capacitor from the bank.

In some embodiments, the multivariable sensor node may be a standalone multivariable sensor node. In some other embodiments, the multivariable sensor node may be a part of a sensor network. In these embodiments, individual multivariable sensor node may be arranged into a sensor network where sensors communicate with each other and with a central station or hub. In particular, individual multivariable sensor nodes may be arranged into a wireless sensor network or wired sensor network. A wireless sensor network is known as WSN. A wired sensor network is known as SN.

Non-limiting examples of hardware requirements for individual nodes include long-lifetime battery or energy-harvesting source, simple signal conditioning components, and low-power processor. Non-limiting examples of software requirements for individual nodes include small needed memory, computational capacity, and high modularity. The arrangement of existing individual wireless sensors into a distributed network may provide challenges in terms of power consumption of individual sensors and handling of massive heterogeneous data from the sensor networks.

In one embodiment, the individual multivariable sensor nodes may be configured for sensing of chemical, biological, and physical parameters. Nonlimiting examples of chemical parameters are concentrations of gases, concentrations of dissolved species in water, type of a liquid, dielectric constant of a liquid. Nonlimiting examples of biological parameters are concentrations of bacteria in water, concentrations of spores and viruses in a sample, type of biological target, composition of biological tissue, and toxicity of detected biological material. Nonlimiting examples of physical parameters are temperature of a sample, conductivity of a sample, corrosion of the sample, cracks in the sample, undesirable voids in the sample, light level in the ambient environment, and the level of alpha, beta, or gamma radiation in the ambient environment.

Poor selectivity of existing individual gas sensors requires combining several sensors into an array to improve gas response selectivity. Thus, in existing systems, each sensor node is required to have an array of sensors requiring a significant amount of electrical power for operation of such sensor node.

In certain embodiments, different types of sensors may be employed in the sensor network. For example, for gas monitoring, it may be desirable to monitor concentration of one or more gases, along with a variety of ambient environmental parameters. Non-limiting examples of such parameters may include air temperature, pressure, humidity, particulate levels, and others. These and other measured parameters in combination with measured gas concentration provide heterogeneous data in the sensor network. Measurements of these and other needed parameters require electrical power for the sensors. The power can become unavailable to measure all needed parameters with existing sensors because of the relatively high power consumption of sensors. Power consumption of individual sensors is the general challenge of the sensor networks. Typically, wireless sensor nodes utilize existing metal oxide semiconductor (MOS) sensors, however, such sensor nodes require up to 420 mW per sensor in the sensor node. Relatively more efficient MOS sensors may require about 50-mW per MOS sensor. When arranged as an assembly of four-sensor array to enhance selectivity, the power consumption is reduced down to about 200 mW. In certain embodiments, the resonance impedance sensors operating as multivariable sensor nodes in the sensor network may require less than about 200mW, less than about 20 mW, and less than about 5 mW, yet providing the response selectivity of an individual multivariable sensor that is higher than the response selectivity of a MOS sensor array.

In one embodiment, the inadequate selectivity of existing gas sensors further prevents their reliable applications in the sensor network. The inadequate selectivity of the gas sensors may result in false readings upon gas measurements of a gas of interest in the presence of the interfering gases. These false readings may render the gas sensors less reliable and useful for demanding applications where high accuracy of gas measurements is needed, for example in diagnostics, and process control.

The poor accuracy of gas measurements with existing sensors make their use impractical and prevents their implementation in the sensor networks.

In certain embodiments, the sensor networks of the present application may include gas sensor nodes that use a synergistic combination of new data-generation and processing concepts with sensor-integration concepts. Sensors arranged as networks may benefit from the data-generation and processing concepts currently unavailable for individual sensors. Individual sensors that are collecting heterogeneous data can be assembled into a sensor network and provide sensing capabilities that are not available from using independently responses from individual sensors.

In certain embodiments, the sensor networks may be used in various fields based on the capabilities of integration of individual sensors to form sensor nodes in wired or wireless sensor networks. In one embodiment, depending on the stationary or mobile nature of the sensor nodes the sensor network may be used in diversity of application scenarios.

Advantageously, the sensor network may be integrated into existing systems and devices. In certain embodiments, the sensor node may be integrated into a component or a system that has a predetermined maintenance schedule. In one embodiment, the maintenance scheduled of the component or system may be matched to a maintenance schedule for the sensor nodes.

In some embodiments, the multivariable sensor nodes or the sensor network may be configured to carry out data-generation and/or processing. The sensor network may comprise stationary sensor nodes for mapping of chemical sources, mobile sensor nodes for dynamic localization of chemical sources, real-time chemical condition monitoring of high-value goods and their associated storage conditions, and combination of sensor nodes with an intelligent inventory management.

Advantageously, in the case of data-generation and processing, the wireless sensor networks the sensor networks may be used for implementation of available infrastructure for communications of sensors. The sensor networks of the present invention provide the advantage of using heterogeneous sensors coupled to multi-parameter coincidence techniques to improve detection accuracy. The sensor networks may use fusion and processing strategies for massive and dynamic data from the sensor networks for time-critical decision-making and for providing ability to identify spurious signals and malfunction of individual sensors on the network. The sensor network may use data acquisition algorithms for individual sensors to reduce power consumption and to extend operational lifetime before replacement of the battery of the individual nodes. In some embodiments, the sensor networks may be used for auto-calibration methods for maintenance-free operation of individual gas sensors in the sensor network. In one embodiment, responses of the individual sensors may be calibrated with respect to local reference monitoring stations.

In one embodiment, impedance analyzers in a miniature or single chip configuration with at least one sensor are integrated or implanted into different objects and fluids for example, into animals, fish, humans, outdoor soil, soil in indoor plants, and industrial infrastructure or components. Nonlimiting examples of implanting or integrating of impedance analyzers in a single chip configuration with at least one sensor into an industrial or consumer infrastructure or components include stationary industrial infrastructure, moving industrial infrastructure, roads, buildings, bridges, vehicles, wind power turbines, wind power turbine blades, aircraft engines, single-use and multiple use bioprocess components, oil drill bits, pipelines, consumer products, wireless computers, mobile computers, cradles of mobile devices, cases of mobile devices, cases of goods, smartphones, tablets, personal digital assistants, watches, industrial remote control units, consumer remote control units, television remote control units, home remote control units, home appliances, consumer appliances, clothing, footwear, helmets, sports equipment, laboratory equipment, laboratory analytical instrumentation, filters, filter cartridges, separators, separation columns, purification columns, containers, reactors, and other articles and items.

In another embodiment, impedance analyzers in a miniature or a single chip configuration with at least one sensor are integrated or implanted into different objects, infrastructure, or components and operate at elevated temperatures. The operating temperature of the impedance analyzers may reach 380 degrees Celsius.

In another embodiment, impedance analyzers in a miniature or a single chip configuration with at least one sensor are integrated or implanted into different objects, infrastructure, or components and operate at reduced temperatures. The operating temperature of the impedance analyzers can reach −85 degrees Celsius.

In one embodiment, an at least one impedance analyzer in a single chip configuration with at least one sensor is deployed into different objects, articles, items, humans, animals, and fish for real-time in-vivo monitoring of chemical, biological, and physical parameters.

In one embodiment, the impedance analyzers in a single chip configuration are implanted or incorporated into a component or an infrastructure, so they have the ability to change their location during the measurements, for example, when they are freely dispersed into a reactor, a container, a blood vessel, a pipeline, or a vessel.

In one embodiment, an impedance analyzer in a single chip configuration with at least one sensor is configured for single-channel measurements where one impedance analyzer measures response from a single sensor. An array of these impedance analyzers is further assembled to perform measurements from multiple locations of the same or different samples. Non-limiting applications of the array of impedance analyzers include measurements in multiple locations over a storage container, a reactor, a bioreactor, in individual wells of micro titer plates, in individual wells of nano titer plates, a human body, a portion of a human body, an animal body, a portion of an animal body, wind blade, a portion of a wind blade, a portion of or full industrial structure, a portion of or full bioprocess structure.

In one embodiment, an impedance analyzer in a single chip configuration with at least one sensor is configured for multiple-channel measurements where one impedance analyzer measures response from a multiple sensors. A single impedance analyzer performs measurements from multiple locations of the same or different samples. Non-limiting applications of the array of impedance analyzers include measurements in multiple locations over a storage container, a reactor, a bioreactor, in individual wells of micro titer plates, in individual wells of nano titer plates, a human body, a portion of a human body, an animal body, a portion of an animal body, wind blade, a portion of a wind blade, a portion of or full industrial structure, a portion of or full bioprocess structure. In a multi-channel measurement, one impedance analyzer measures responses from several sensors where the sensors provide responses of the same nature (for example, the complex permittivity of the fluid) or of different nature (for example, pressure, conductivity, temperature, pH, glucose). Responses of the same or different nature are further implemented to build a tomographic representation of the fluid sample in contact or in proximity to sensors.

Figure 17:
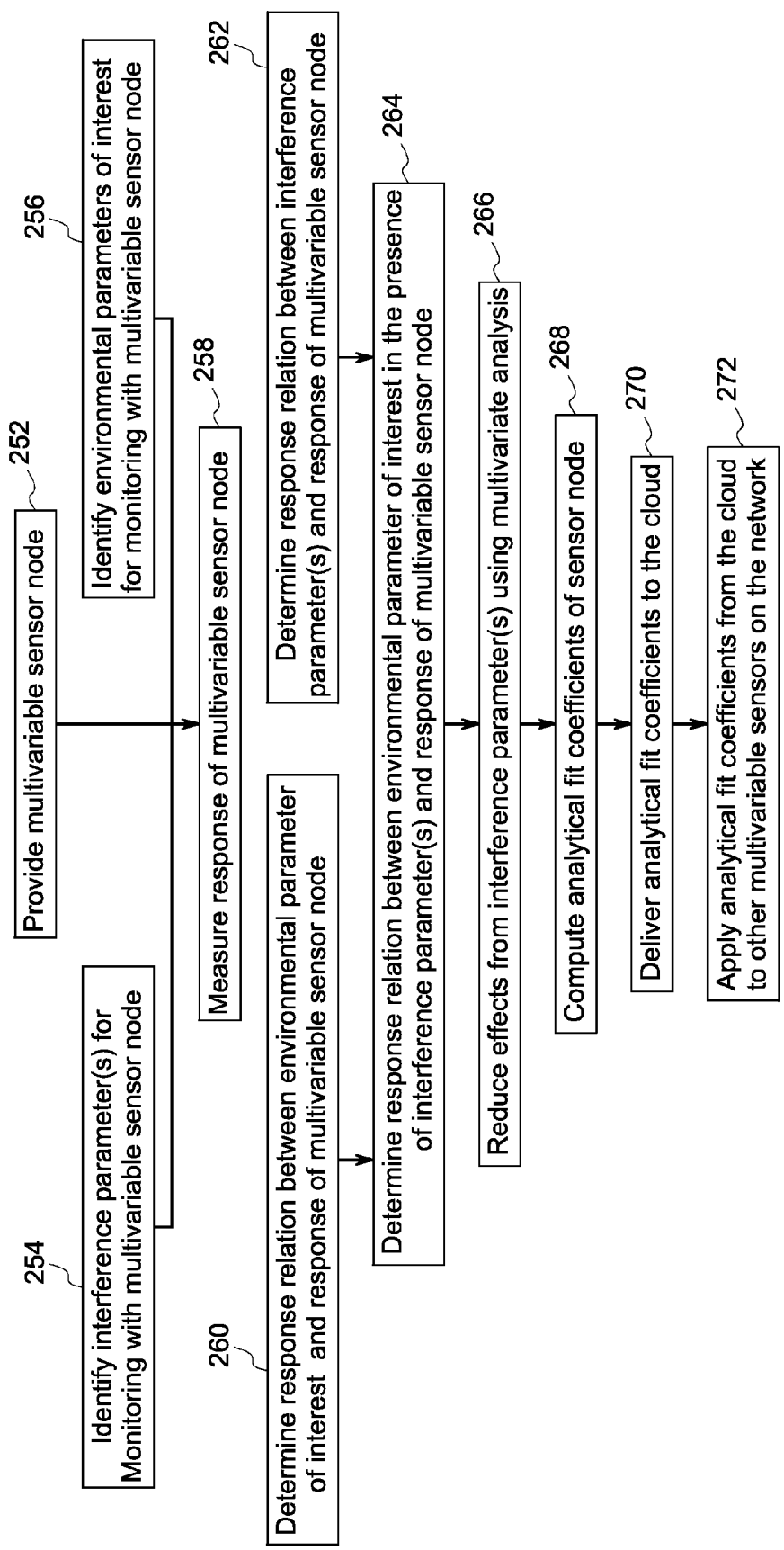
FIG. 17 shows a block diagram of re-calibration steps of individual multivariable sensors in a sensor network with expected presence of interferences.

FIG. 17 illustrates a method for re-calibration of individual multivariable sensors in a sensor network with anticipated presence of interferences. At step 252, one or more multivariable sensor nodes are provided. At step 254, environmental parameters of interest that may be monitored by the multivariable sensor nodes may be identified. At step 256, interference parameters of interest that may produce an interference response by the multivariable sensor nodes may be identified. In certain embodiments, prior to deployment of multivariable sensors, the multivariable sensors may be calibrated for their response to analytes of interest in the absence and presence of interferences as required by the intended application. The resulting responses may be tabulated and described by continuous mathematical functions. In a non-limiting example, the resulting responses may be described by second-order polynomials with analytical fit coefficients. Using the polynomial functions with these analytical fit coefficients, concentrations of analytes may be calculated from the multivariable response of the sensor at different levels of interferences. In some embodiments, the coefficients of the calibration polynomial functions corresponding to each sensor may be stored in memory of each sensor or in a computer network cloud. Polynomial functions are only a non-limiting example of a mathematical function applied to describe the calibration response of the sensor. Other non-limiting examples of such functions may include linear functions, higher order polynomial functions, and any other functions known in the art.

In some embodiments, periodic re-calibration of sensors in a network is desirable to maintain the adequate accuracy of response of sensors. In certain embodiments, one or more multivariable sensors of a network may be subjected to controlled exposure to an analyte, or interference, or both. By way of example, the multivariable sensors may be exposed to one or more of a known analyte concentration, known amount of interference, or known type of interference. In one embodiment, the multivariable sensors may be periodically subjected to the controlled exposure. The controlled exposure of the multivariable sensors provides the re-calibration of the multivariable sensors that are subjected to the controlled exposure.

At step 258, responses from the multivariable sensor nodes in response to exposure to one or more environmental parameter of interest may be measured. The sensor is exposed to at least one environmental parameter of interest at a predetermined single level or more than one level and at least one interference factor. For example, concentrations of water vapor and toluene vapor in air may be the environmental parameters of interest while temperature variations of air may be the interference factor.

At step 260, a response relation may be formed between the environmental parameters of interest and response of the multivariable sensor nodes. Similarly, at step 262, a response relation may be formed between the one or more interference parameters and response of the multivariable sensor nodes. Next, at step 264, a response relation may be formed between the environmental parameters of interest in the presence of the one or more interference parameters and response of the multivariable sensor nodes. At step 266, contribution of the interference parameters may be reduced from the response of the multivariable sensor nodes to obtain the response of the multivariable sensor nodes due to the environmental parameters. At step 268, new analytical fit coefficients may be computed that relate multivariable sensor response, parameter value, and interference value from the re-calibration procedure. New analytical fit coefficients are compared with the coefficients previously stored in the sensor or in the central computing center of the network cloud. The response of the re-calibrated multivariable sensor is collected upon exposure to its environment; the value of the sensor response is converted into the value of the parameters of interest using the stored analytical fit coefficients. At step 270, the computed values of the parameters are delivered to the central computing center of the network cloud. At step 272, the computed values of the analytical fit coefficients from the cloud may be applied to other multivariable sensors on the network to obtain analytical fit coefficients of the individual sensor nodes of the network. The values of the calibration coefficients obtained from one multivariable sensor on the network may be further applied to correct multivariable responses of other sensors on the network through the scaling coefficients for individual sensors.

In an alternate embodiment, controlled sensor re-calibration involves exposure of the sensor not to an analyte but to a material with well-defined dielectric or other desired properties and recording the sensor response. A prior established correlation between the sensor response to this material and a real sample containing the analyte or interference factor is used for calibration. More than one material may be used to obtain several calibration points. The values of the calibration coefficients obtained from one multivariable sensor on the network are further applied to correct multivariable responses of other sensors on the network through the scaling coefficients for individual sensors.

In certain embodiments, the multivariable sensor nodes, and sensor networks may be used in integration with mobile phones; autonomous multivariable sensor nodes, GPS-equipped mobile robotic devices (e.g., for location and validation of pollution, homeland security threat, and other sources), integration of sensors into public or personal transportation vehicles for pollution and homeland security threat monitoring with a significant benefit of matching vehicle/sensor maintenance schedules.

In area monitoring, the sensor network is deployed over a region for monitoring purposes. In one example, the sensor network may be used for defense purposes for example, to detect enemy intrusion. In another example, the sensor network may be used in a civilian environment, for example, to geo-fence gas or oil pipelines.

When the sensors detect the event being monitored (heat, pressure, biological plume, chemical plume), the event is reported to one of the base stations, which then takes appropriate action (e.g., send a message on the internet or to a satellite). Similarly, wireless sensor networks can use a range of sensors to detect the presence of vehicles ranging from motorcycles to train cars.

EXAMPLE

Figure 18:
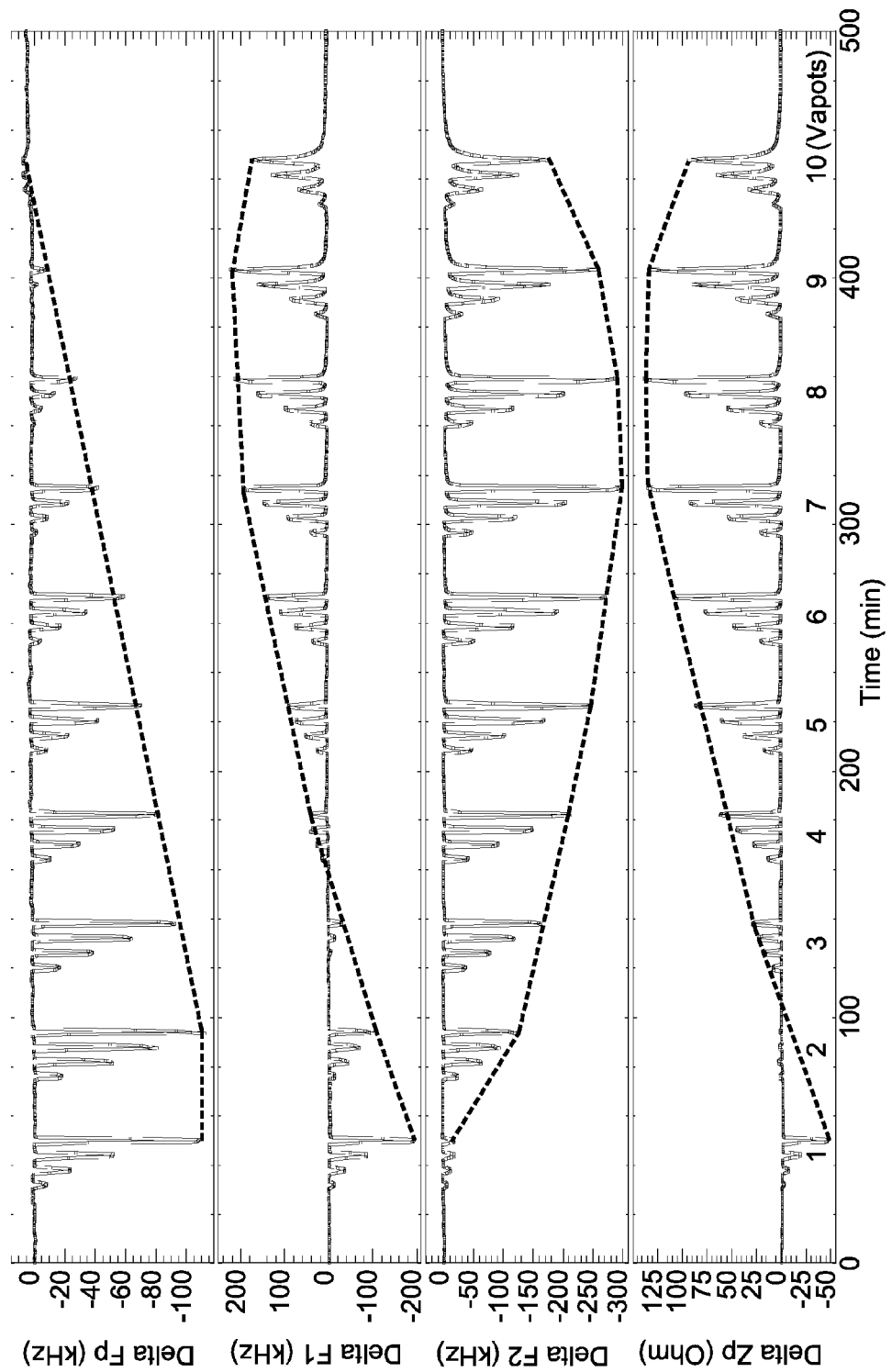
FIGS. 18-19 are test data demonstrating operation of a single multivariable sensor for discriminating between ten different vapors, in accordance with embodiments of the invention.
Figure 19:
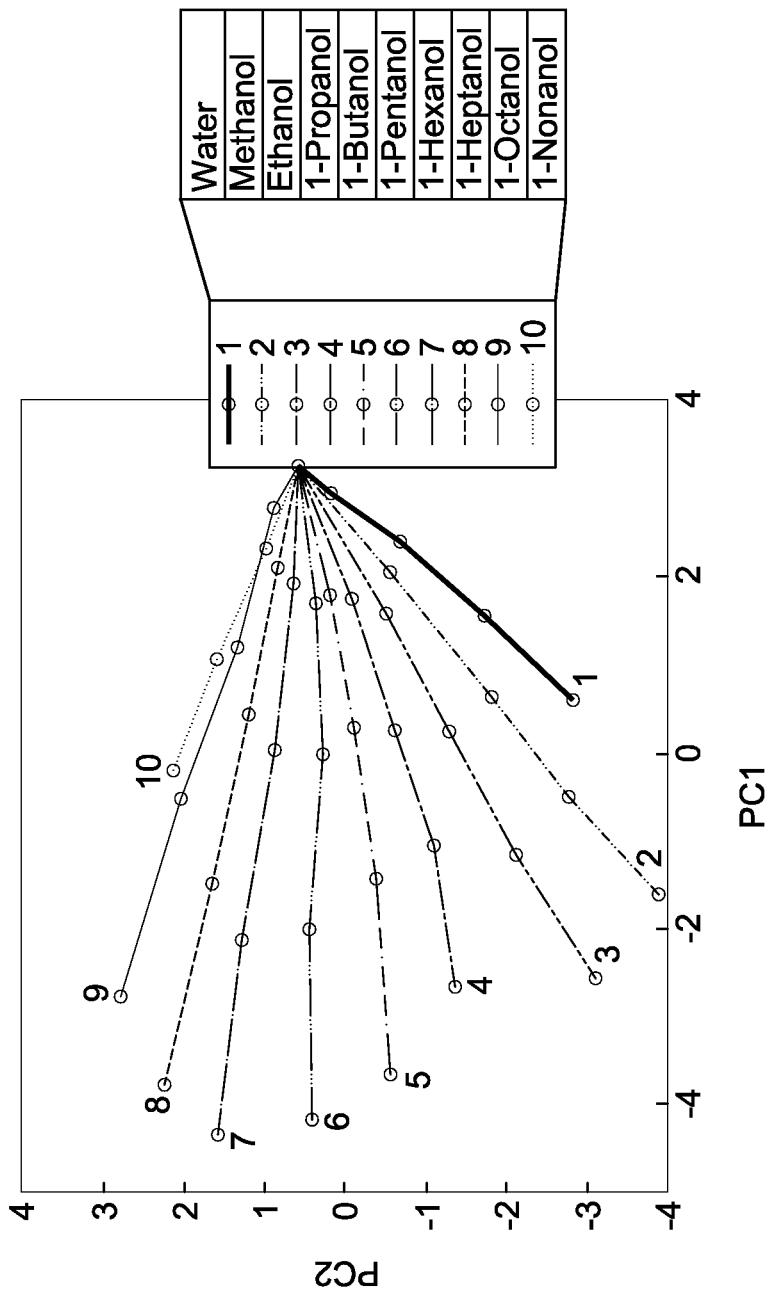

FIGS. 18-19 illustrate an example test data demonstrating operation of a single multivariable sensor for discriminating between ten different vapors.

As illustrated in FIGS. 18A-18D, test results were obtained to demonstrate the selective detection of individual, closely related vapors, such as alcohols from their homologous series and water vapor as a possible interferent, using a single multivariable sensor. In the illustrated embodiment, the sensor was exposed to the 10 vapors over a period of time. The 10 vapors included (1) water, (2) methanol, (3) ethanol, (4) 1-propanol, (5) 1-butanol, (6) 1-pentanol, (7) 1-hexanol, (8) 1-heptanol, (9) 1-octanol, (10) 1-nonanol. The chosen sensing material was an organic ligand attached to gold nanoparticles, which was applied as a sensing film onto a multivariate sensor by drop casting. During the experiment, the multivariable sensor was incrementally exposed to 10 vapors over a period of time. The test was conducted in steps, where the concentration of each respective vapor was increased with each step. Measurements were performed with concentrations of all vapors at 0, 0.089, 0.178, 0.267, and 0.356 $P/P_o$, where P is the partial pressure and $P_o$ is the saturated vapor pressure. By monitoring changes in certain properties and examining various responses over time and at increasing concentration levels, the data demonstrated the ability to distinguish the 10 vapors tested in the above-described experiment.

For instance, the frequency position $F_p$, the resonant $F_1$ and anti-resonant $F_2$ frequencies of $Z_{im}(f)$, and the magnitude $Z_p$ of the real part of the total resistance $Z_{re}(f)$ are illustrated in FIGS. 18A-18D. The tests for each vapor were conducted and plotted over 4 increments of increasing concentration, as clearly indicated by the stepped nature of the response for each vapor. The relative differences in the direction and the magnitude of these responses constitute a robust response pattern for these vapors and their different concentrations using a single sensor. The response patterns are followed by the dotted lines in FIGS. 18A-18D. Based solely on the individual responses shown in FIGS. 18A-18D and other responses from the multivariable sensor, the exemplary sensor is not suitable for detecting and distinguishing between these ten vapors because the magnitude and direction of only the individual responses does not provide a unique signature for each vapor. However, the combination of these individual responses, that is, spectral parameters, provide this unique signature for each vapor.

The use of multivariate analysis, for example, principal components analysis (PCA), produced a multivariate signature from a single multivariable sensor as illustrated in FIG. 19. As will be appreciated, PCA analysis is a mathematical process, known to those skilled in the art that is used to reduce multi-dimensional data sets to lower dimensions for analysis. For instance, the various responses for each vapor at a given concentration may be reduced to a single data point, and from this, a single response for each vapor, which may be represented as a vector, may be discerned, as illustrated in FIG. 19. FIG. 19 illustrates a PCA plot of the various responses of the 10 vapors described with reference to FIGS. 18A-18D. In the illustrated embodiment, abscissa represents principal component 1 (PC1) and ordinate represents principal component 2 (PC2). PC1 refers to the sensor response with the most variation, while PC2 refers to the response with the next most variation. As shown in FIG. 19, the 10 vapors are distinguishable from one another. Accordingly, the experimental test data provides support for a sensor capable of discerning between at least ten vapors, here water (1), methanol (2), ethanol (3), 1-propanol (4), 1-butanol (5), 1-pentanol (6), 1-hexanol (7), 1-heptanol (8), 1-octanol (9), and 1-nonanol (10). Existing individual sensors or even sensor arrays may not achieve this level of vapor discrimination. Advantageously, the 10 vapors were discriminated/individually identified in the illustrated embodiment of FIG. 19. In addition, only a single sensor was used (and not a sensor array) to individually identify the 10 different vapors.

While only certain features of the invention have been illustrated and described herein, many modifications and changes will occur to those skilled in the art. It is, therefore, to be understood that the appended claims are intended to cover all such modifications and changes as fall within the scope of the invention.

The invention claimed is:

1. A multivariable sensor node comprising: a resonant sensor; an impedance analyzer comprising an analog to digital converter (ADC) and a master clock for the ADC, wherein a number of bits in the ADC is reduced to reduce a total power consumption of the impedance analyzer, and wherein a speed of the master clock for the ADC is dynamically adjusted based on an excitation frequency, wherein the impedance analyzer is configured to monitor a plurality of responses from the resonant sensor, and wherein the resonant sensor and the impedance analyzer form a single-chip arrangement in the multivariable sensor node; a data transmitter configured to transmit sensor data from the resonant sensor; and an on-board electrical energy source configured to power the impedance analyzer and the data transmitter.

2. The multivariable sensor node of claim 1, wherein the on-board electrical energy source comprises an energy harvesting element.

3. The multivariable sensor node of claim 2, wherein the energy harvesting element is configured to harvest energy from an ambient environment comprising a thermal energy source, a radio frequency energy source, a light energy source, a vibration energy source, a motion energy source, or combinations thereof.

4. A multivariable sensor node, comprising:
a resonant sensor;
an impedance analyzer configured to monitor a resonance property of the resonant sensor, wherein the impedance analyzer comprises:
an analog to digital converter (ADC), wherein a number of bits in the ADC is reduced to reduce a total power consumption of the impedance analyzer;
a voltage excitation generator comprising a direct digital synthesizer (DDS), a digital phase locked loop (PLL), or both, and a voltage-mode digital to analog converter (DAC);
a receiver comprising a current-to-voltage converter (CVC) trans-impedance amplifier; and
a master clock for the DDS, DAC, and ADC, wherein a speed of the master clock for the DDS, DAC, and ADC is dynamically adjusted based on an excitation frequency,
wherein the resonant sensor and the impedance analyzer form a single-chip arrangement in the multivariable sensor node.

5. The multivariable sensor node of claim 4, wherein the impedance analyzer is configured for multi-channel measurements.

6. The multivariable sensor node of claim 4, wherein the digital phase locked loop of the voltage excitation generator is configured to generate two signals in quadrature, and wherein the receiver comprises the ADC and a mixer to down-convert a resonant sensor signal to a lower frequency.

7. The multivariable sensor node of claim 6, wherein the resonant sensor is part of an impedance analyzer signal source, and wherein the impedance analyzer further comprises:
an amplitude control loop to regulate an excitation amplitude of the resonant sensor; and
a phase control loop configured to detect a phase of the resonant sensor signal.

8. A multivariable sensor node, comprising:
a sensor;
an impedance analyzer configured to monitor a frequency response of the sensor, wherein the impedance analyzer comprises:
a voltage excitation generator comprising a direct digital synthesizer (DDS) and a voltage-mode digital to analog converter (DAC);
a receiver comprising a current-to-voltage converter (CVC) trans-impedance amplifier and an analog to digital converter (ADC), wherein a number of bits in the ADC is reduced to reduce a total power consumption of the impedance analyzer, and
a master clock for the DDS, DAC, and ADC, wherein a speed of the master clock for the DDS, DAC, and ADC is dynamically adjusted based on an excitation frequency,
wherein the impedance analyzer and the sensor are integrated into a single-chip to form the multivariable sensor node.

9. The multivariable sensor node of claim 8, where the sensor is a non-resonant sensor.

* * * * *